(12) United States Patent
Gao et al.

(10) Patent No.: US 12,381,128 B2
(45) Date of Patent: Aug. 5, 2025

(54) STRUCTURES WITH THROUGH-SUBSTRATE VIAS AND METHODS FOR FORMING THE SAME

(71) Applicant: ADEIA SEMICONDUCTOR BONDING TECHNOLOGIES INC., San Jose, CA (US)

(72) Inventors: Guilian Gao, San Jose, CA (US); Gaius Gillman Fountain, Jr., Youngsville, NC (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 812 days.

(21) Appl. No.: 17/562,967

(22) Filed: Dec. 27, 2021

(65) Prior Publication Data

US 2022/0208650 A1    Jun. 30, 2022

Related U.S. Application Data

(60) Provisional application No. 63/131,226, filed on Dec. 28, 2020.

(51) Int. Cl.
*H01L 23/48* (2006.01)
*H01L 21/768* (2006.01)

(52) U.S. Cl.
CPC ...... *H01L 23/481* (2013.01); *H01L 21/76816* (2013.01); *H01L 21/76843* (2013.01); *H01L 21/76877* (2013.01); *H01L 21/76898* (2013.01)

(58) Field of Classification Search
CPC ............. H01L 23/481; H01L 21/76816; H01L 21/76843; H01L 21/76877; H01L 21/76898
See application file for complete search history.

(56) References Cited

U.S. PATENT DOCUMENTS 4,612,083 A    9/1986    Yasumoto et al.
4,818,728 A    4/1989    Rai et al.
(Continued)

FOREIGN PATENT DOCUMENTS

CN    105140144 A    12/2015
CN    106653720 A    5/2017
(Continued)

OTHER PUBLICATIONS

Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
(Continued)

*Primary Examiner* — Robert G Bachner
(74) *Attorney, Agent, or Firm* — Knobbe, Martens, Olson & Bear, LLP

(57) ABSTRACT

A microelectronic structure is disclosed. The microelectronic structure can include a bulk semiconductor portion that has a first surface and a second surface opposite the first surface. The microelectronic structure can include a via structure that extends at least partially through the bulk semiconductor portion along a direction non-parallel to the first surface. The microelectronic structure can include a first dielectric barrier layer that is disposed on the first surface of the bulk semiconductor portion and extends to the via structure. The microelectronic structure can include a second dielectric layer that is disposed on the first dielectric barrier layer and extends to the via structure.

20 Claims, 16 Drawing Sheets

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,387,944 B2 | 6/2008 | Tong et al. |
| 7,473,633 B2 | 1/2009 | Furukawa et al. |
| 7,485,968 B2 | 2/2009 | Enquist et al. |
| 7,553,744 B2 | 6/2009 | Tong et al. |
| 7,750,488 B2 | 7/2010 | Patti et al. |
| 7,772,123 B2 | 8/2010 | Birner et al. |
| 7,803,693 B2 | 9/2010 | Trezza |
| 7,807,549 B2 | 10/2010 | Tong et al. |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,531,000 B2 | 9/2013 | Yoneda |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,716,134 B2 | 5/2014 | Edelstein et al. |
| 8,772,155 B2 | 7/2014 | Haimson et al. |
| 8,796,135 B2 | 8/2014 | Oganesian et al. |
| 8,802,538 B1 | 8/2014 | Liu |
| 8,809,123 B2 | 8/2014 | Liu et al. |
| 8,841,002 B2 | 9/2014 | Tong |
| 8,847,380 B2 | 9/2014 | Oganesian et al. |
| 8,916,448 B2 | 12/2014 | Cheng et al. |
| 8,988,299 B2 | 3/2015 | Kam et al. |
| 9,000,600 B2 | 4/2015 | Uzoh et al. |
| 9,040,385 B2 | 5/2015 | Chen et al. |
| 9,064,937 B2 | 6/2015 | Edelstein et al. |
| 9,076,785 B2 | 7/2015 | Uzoh |
| 9,082,627 B2 | 7/2015 | Tong et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,032 B2 | 5/2016 | Liu et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,343,369 B2 | 5/2016 | Du et al. |
| 9,349,669 B2 | 5/2016 | Uzoh et al. |
| 9,362,203 B2 | 6/2016 | Oganesian et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,425,155 B2 | 8/2016 | Liu et al. |
| 9,431,368 B2 | 8/2016 | Enquist et al. |

(56) References Cited

U.S. PATENT DOCUMENTS

| | | |
|---|---|---|
| 9,437,572 B2 | 9/2016 | Chen et al. |
| 9,443,796 B2 | 9/2016 | Chou et al. |
| 9,461,007 B2 | 10/2016 | Chun et al. |
| 9,496,154 B2 | 11/2016 | Tosaya et al. |
| 9,496,218 B2 | 11/2016 | Lee et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,607,928 B2 | 3/2017 | Uzoh |
| 9,620,481 B2 | 4/2017 | Edelstein et al. |
| 9,656,852 B2 | 5/2017 | Cheng et al. |
| 9,679,867 B2 | 6/2017 | Ashidate et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,847,277 B2 | 12/2017 | Oganesian et al. |
| 9,852,988 B2 | 12/2017 | Enquist et al. |
| 9,859,254 B1 | 1/2018 | Yu et al. |
| 9,865,581 B2 | 1/2018 | Jang et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,129 B2 | 5/2018 | Liu et al. |
| 9,960,142 B2 | 5/2018 | Chen et al. |
| 10,002,844 B1 | 6/2018 | Wang et al. |
| 10,026,605 B2 | 7/2018 | Doub et al. |
| 10,074,594 B2 | 9/2018 | Fang et al. |
| 10,075,657 B2 | 9/2018 | Fahim et al. |
| 10,103,122 B2 | 10/2018 | Liu et al. |
| 10,147,641 B2 | 12/2018 | Enquist et al. |
| 10,163,757 B2 | 12/2018 | Uzoh |
| 10,204,893 B2 | 2/2019 | Uzoh et al. |
| 10,211,166 B2 | 2/2019 | Matsuo |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,312,275 B2 | 6/2019 | Hynecek |
| 10,354,942 B2 | 7/2019 | Oganesian et al. |
| 10,418,277 B2 | 9/2019 | Cheng et al. |
| 10,431,614 B2 | 10/2019 | Gambino et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,367,652 B2 | 6/2022 | Uzoh et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,462,419 B2 | 10/2022 | Haba |
| 11,476,213 B2 | 10/2022 | Haba et al. |
| 11,515,291 B2 | 11/2022 | DeLaCruz et al. |
| 11,756,880 B2 | 9/2023 | Uzoh et al. |
| 12,125,784 B2 | 10/2024 | Uzoh et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2002/0113241 A1 | 8/2002 | Kubota et al. |
| 2003/0092220 A1 | 5/2003 | Akram |
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2003/0193076 A1 | 10/2003 | Patti |
| 2004/0084414 A1 | 5/2004 | Sakai et al. |
| 2004/0157407 A1 | 8/2004 | Tong et al. |
| 2004/0217483 A1 | 11/2004 | Hedler et al. |
| 2004/0262772 A1 | 12/2004 | Ramanathan et al. |
| 2005/0104224 A1 | 5/2005 | Huang et al. |
| 2005/0181542 A1 | 8/2005 | Enquist |
| 2006/0024950 A1 | 2/2006 | Choi et al. |
| 2006/0057945 A1 | 3/2006 | Hsu et al. |
| 2007/0096294 A1 | 5/2007 | Ikeda et al. |
| 2007/0111386 A1 | 5/2007 | Kim et al. |
| 2007/0212870 A1 | 9/2007 | Yang et al. |
| 2007/0222048 A1 | 9/2007 | Huang |
| 2007/0295456 A1 | 12/2007 | Gudeman et al. |
| 2007/0296073 A1 | 12/2007 | Wu et al. |
| 2008/0081433 A1 | 4/2008 | Koh et al. |
| 2008/0122092 A1 | 5/2008 | Hong |
| 2008/0164573 A1* | 7/2008 | Basker ............... H01L 21/486 257/E23.09 |
| 2009/0197408 A1 | 8/2009 | Lehr et al. |
| 2009/0200668 A1 | 8/2009 | Yang et al. |
| 2010/0164066 A1 | 7/2010 | Di Franco |
| 2011/0074040 A1 | 3/2011 | Frank et al. |
| 2011/0084400 A1 | 4/2011 | Fujii |
| 2011/0097853 A1 | 4/2011 | Kim et al. |
| 2011/0193199 A1 | 8/2011 | Filippi et al. |
| 2011/0290552 A1 | 12/2011 | Palmateer et al. |
| 2012/0133010 A1 | 5/2012 | Komukai |
| 2012/0153492 A1 | 6/2012 | Bachman et al. |
| 2012/0211894 A1 | 8/2012 | Aoyagi |
| 2012/0212384 A1 | 8/2012 | Kam et al. |
| 2012/0319280 A1 | 12/2012 | Suganuma et al. |
| 2013/0020704 A1 | 1/2013 | Sadaka |
| 2013/0075900 A1 | 3/2013 | Shim et al. |
| 2013/0093092 A1 | 4/2013 | Kanki et al. |
| 2013/0105968 A1 | 5/2013 | Lu et al. |
| 2013/0119543 A1 | 5/2013 | Yu et al. |
| 2013/0119547 A1 | 5/2013 | Kim et al. |
| 2013/0221527 A1 | 8/2013 | Yang et al. |
| 2013/0249098 A1 | 9/2013 | West |
| 2013/0256913 A1 | 10/2013 | Black et al. |
| 2013/0320556 A1 | 12/2013 | Liu et al. |

(56) References Cited

U.S. PATENT DOCUMENTS

| | | |
|---|---|---|
| 2013/0328186 A1 | 12/2013 | Uzoh et al. |
| 2014/0084481 A1 | 3/2014 | Zhang et al. |
| 2014/0117546 A1 | 5/2014 | Liu et al. |
| 2014/0131869 A1 | 5/2014 | Pendse |
| 2014/0175655 A1 | 6/2014 | Chen et al. |
| 2014/0191414 A1 | 7/2014 | Kim |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0028476 A1 | 1/2015 | Kirby et al. |
| 2015/0048496 A1 | 2/2015 | Chiu et al. |
| 2015/0064498 A1 | 3/2015 | Tong |
| 2015/0108644 A1 | 4/2015 | Kuang et al. |
| 2015/0155263 A1 | 6/2015 | Farooq et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2015/0262839 A1 | 9/2015 | Kim et al. |
| 2015/0279798 A1 | 10/2015 | Park |
| 2015/0311141 A1 | 10/2015 | Wu et al. |
| 2016/0049371 A1 | 2/2016 | Lee et al. |
| 2016/0086923 A1 | 3/2016 | Best |
| 2016/0148874 A1 | 5/2016 | Peng et al. |
| 2016/0204002 A1 | 7/2016 | Wallace et al. |
| 2016/0343682 A1 | 11/2016 | Kawasaki |
| 2017/0053897 A1 | 2/2017 | Lai et al. |
| 2017/0062366 A1 | 3/2017 | Enquist |
| 2017/0162440 A1 | 6/2017 | Lu et al. |
| 2017/0179029 A1 | 6/2017 | Enquist et al. |
| 2017/0194271 A1 | 7/2017 | Hsu et al. |
| 2017/0358551 A1 | 12/2017 | Liu et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0219038 A1 | 8/2018 | Gambino et al. |
| 2018/0226371 A1 | 8/2018 | Enquist |
| 2018/0273377 A1 | 9/2018 | Katkar et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0019743 A1 | 1/2019 | Fang et al. |
| 2019/0057756 A1 | 2/2019 | Kim et al. |
| 2019/0088535 A1 | 3/2019 | Yan et al. |
| 2019/0109042 A1 | 4/2019 | Katkar et al. |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0164939 A1 | 5/2019 | Yang |
| 2019/0189603 A1 | 6/2019 | Wang et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035630 A1 | 1/2020 | Kameshima |
| 2020/0035641 A1 | 1/2020 | Fountain, Jr. et al. |
| 2020/0227367 A1 | 7/2020 | Haba et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0134748 A1 | 5/2021 | Liu |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0351112 A1 | 11/2021 | Park et al. |
| 2021/0358767 A1 | 11/2021 | Tanaka et al. |
| 2021/0366820 A1 | 11/2021 | Uzoh |
| 2021/0391302 A1 | 12/2021 | Kao et al. |
| 2021/0407941 A1 | 12/2021 | Haba |
| 2022/0013456 A1 | 1/2022 | Uzoh et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0129594 A1 | 4/2023 | Sharangpani et al. |
| 2023/0130259 A1 | 4/2023 | Haba et al. |
| 2023/0132632 A1 | 5/2023 | Katkar et al. |
| 2023/0139612 A1 | 5/2023 | Kim et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |

(56) References Cited

U.S. PATENT DOCUMENTS

| | | |
|---|---|---|
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0379539 A1 | 11/2024 | Uzoh et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |

FOREIGN PATENT DOCUMENTS

| | | |
|---|---|---|
| CN | 106920795 A | 7/2017 |
| CN | 107731668 A | 2/2018 |
| CN | 107993927 A | 5/2018 |
| CN | 107993928 A | 5/2018 |
| CN | 109155301 A | 1/2019 |
| CN | 109411443 A | 3/2019 |
| CN | 109417073 A | 3/2019 |
| CN | 109417075 A | 3/2019 |
| CN | 109417077 A | 3/2019 |
| CN | 109643643 A | 4/2019 |
| CN | 109844915 A | 6/2019 |
| CN | 113097129 A | 7/2021 |
| EP | 0 465 227 A2 | 1/1992 |
| EP | 2 408 006 A2 | 1/2012 |
| EP | 2 863 420 A1 | 4/2015 |
| JP | 61-030059 | 2/1986 |
| JP | 01-168040 | 7/1989 |
| JP | 4-259249 | 9/1992 |
| JP | 05-029183 | 2/1993 |
| JP | 5-198739 | 8/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |
| JP | 2003-023071 | 1/2003 |
| JP | 2004-200547 | 7/2004 |
| JP | 2005-038942 A | 2/2005 |
| JP | 2005-086089 | 3/2005 |
| JP | 2005-093486 | 4/2005 |
| JP | 2005-093954 A | 4/2005 |
| JP | 2005-135988 | 5/2005 |
| JP | 2013-033786 A | 2/2013 |
| JP | 2013-033900 A | 2/2013 |
| JP | 2018-160519 | 10/2018 |
| JP | 2019-129199 | 8/2019 |
| KR | 10-2012-0106366 | 9/2012 |
| KR | 10-2015-0097798 | 8/2015 |
| TW | 442909 | 6/2001 |
| TW | 476145 | 2/2002 |
| TW | 201318085 A | 5/2013 |
| WO | WO 01/61743 A1 | 8/2001 |
| WO | WO 03/054954 A2 | 7/2003 |
| WO | WO 2005/043584 A2 | 5/2005 |
| WO | WO 2006/100444 A1 | 9/2006 |
| WO | WO 2012/013162 A1 | 2/2012 |
| WO | WO 2016/185883 A1 | 11/2016 |
| WO | WO 2017/151442 A1 | 9/2017 |
| WO | WO 2017/155002 A1 | 9/2017 |
| WO | WO 2019/146427 A1 | 8/2019 |

OTHER PUBLICATIONS

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820."

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

Amirfeiz et al., "Formation of silicon structures by plasma-activated wafer bonding," Journal of the Electrochemical Society, 2000, vol. 147, No. 7, pp. 2693-2698.

Appeal Decision of Rejection issued on Apr. 12, 2016 in Japanese Patent Application No. 2008-526104, in 14 pages.

Aspar, B. et al., "The smart-cut process: Status and developments," Proc. Electrochem Soc., 1999, vol. 99-53, pp. 48-59.

Bower, R. et al., "Low temperature Si3N4 direct bonding," Appl. Phys. Lett., Jun. 28, 1993, vol. 62, No. 26, pp. 3485-3487.

Canadian Office Action issued Aug. 1, 2013 in Canadian Patent Application No. 2,618,191, 4 pages.

Canadian Office Action, mailed May 16, 2012 for Canadian Patent Application No. 2,515,375, with international preliminary report, 2 pages.

Ceramic Microstructures: Control at the Atomic Level, Recent Progress in Surface Activated Bonding, 1998, pp. 385-389.

"Chemical Mechanical Polishing (CMP) Metrology with Advanced Surface Polisher," Park Systems, 4 pages.

Chung et al., "Room temperature GaAseu+Si and InPeu+Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

D'Agostino, R., "Plasma etching of Si and SiO2 in SF6—O2 mixtures," J. Appl. Phys., Jan. 1981, vol. 52, No. 1, pp. 162-167.

Decision—Request for Trail Granted, Inter Partes Review, U.S. Pat. No. 7,485,968, Case IPR2013-00381, dated Dec. 18, 2013, in 27 pages.

Declaration of Richard A. Blanchard in Support of Petition for inter partes review of U.S. Pat. No. 7,485,968, dated Jun. 13, 2013, pp. 1-18.

(56) References Cited

OTHER PUBLICATIONS

Dysard, Jeffrey M. et al., "CMP solutions for the integration of high-k metal gate technologies," ECS Transactions, 2010, vol. 33, Issue 10, pp. 77-89.
Fan et al., "Copper water bonding," Electrochem. Solid-State Lett., U.S.A., the Electrochemical Society, Aug. 6, 1999, vol. 2, No. 10, pp. 534-536.
Fang, S.J. et al., "Advanced process control in dielectric chemical mechanical polishing (CMP)," Texas Instruments, Silicon Technology Development, 8 pages.
Farrens et al., "Chemical free room temperature wafer to wafer direct bonding," J. Electrochem. Soc., the Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Final Written Decision, Inter PartesReview, U.S. Pat. No. 7,485,968, Case IPR2013-00381, dated Feb. 27, 2014, in 3 pages.
Gösele et al., "Semiconductor Wafer Bonding: A flexible approach to materials combinations in microelectronics; micromechanics and optoelectronics," IEEE, 1997, pp. 23-32.
Gösele et al., "Silicon layer transfer by wafer bonding," Proceedings of the Second International Symposium on Semiconductor Wafer Bonding: Science, Technology and Applications, the Electrochemical Society Proceedings, vol. 93-29 (1993), pp. 395-409.
Handbook of Thin Film Technology, Maissel and Glang, 1983 Reissue, pp. 12-24.
Harendt, C. et al., "Vertical polysilicon interconnects by aligned wafer bonding," Electrochemical Society Proceedings, 1998, vol. 97-36, pp. 501-508.
Hayashi, Y. et al., "Fabrication of three-dimensional IC using cumulatively bonded IC (Cubic) technology," VSLI Tech. Dog., 1990, pp. 95-96.
Hizukuri, M. et al., "Dynamic strain and chip damage during ultrasonic flip chip bonding," Jpn. J. Appl. Phys. 40, 2001, pp. 3044-3048.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
"Hybrid Bonding—Patent Landscape Analysis," from Technologies to IP Business Intelligence, KnowMade Patent & Technology Intelligence, www.kmowmade.com, Nov. 2019, 81 pages.
Hymes, S. et al., "Determination of the planarization distance for copper CMP process," 6 pages.
Iida, A. et al., "The study of initial mechanism for Al—Au solid phase diffusion flip-chip bonding," Jpn. J. Appl. Phys. 40, 1997, pp. 3044-3661.
International Search Report and Written Opinion mailed Apr. 22, 2019 in International Application No. PCT/US2018/064982, 13 pages.
International Search Report and Written Opinion mailed Mar. 7, 2019, in International Application No. PCT/US2018/060044, 14 pages.
International Search Report and Written Opinion, dated Jan. 10, 2019, for PCT Application No. PCT/US2018/051537, 3 pages.
International Search Report and Written Opinion mailed Oct. 8, 2019, in International Application No. PCT/US2019/037072, 13 pages.
International Search Report and Written Opinion mailed Dec. 6, 2019, in International Application No. PCT/US2019/047513, 12 pages.
International Search Report and Written Opinion mailed Apr. 21, 2022, in International Application No. PCT/US2021/073125, 14 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kissinger, G. et al., "Void-free silicon-wafer-bond stregthening in the 200-400 C range," Sensors and Actuators A, 1993, vol. 36, pp. 149-156.
Krauter, G. et al., "Low temperature silicon direct bonding for application in micromechanics: bonding energies for different combinations of oxides," Sensors and Actuators A, 1998, vol. 70, pp. 271-275.
Kunio, Takemitsu, "Three dimensional IC technology, using cubic method," Journal of the JWS, Japan Welding Society, Apr. 5, 1994, vol. 63, No. 3, pp. 185-189.
Lee, D. et al., "Slurry components in metal chemical mechanical planarization (CMP) process: A review," International Journal of Precision Engineering and Manufacturing, Dec. 2016, vol. 17, No. 12, pp. 1751-1762.
Li, Yuzhuo, "Key factors that influence step height reduction efficiency and defectivity during metal CMP," Clarkson University, Levitronix CMP Users' Conference 2006, 2006, 32 pages.
Li, Y.A. et al., "Low temperature copper to copper direct bonding," Jpn. Appl. Phys. 37, 1998, pp. L1068-L1069.
Li, Y.A. et al., "Systematic low temperature silicon bonding using pressure and temperature," Jpn. J. Appl. Phys., vol. 37, 1998, pp. 737-741.
Liu, Zi-Yu et al. "Detection and formation mechanism of microdefects in ultrafine pitch Cu—Cu direct bonding," Chin. Phys. B, 2016, vol. 25, No. 1, pp. 018103-1-018103-7.

(56) References Cited

OTHER PUBLICATIONS

Liu, C. et al., "Low-temperature direct copper-to-copper bonding enabled by creep on (111) surfaces of nanotwinned Cu," Scientific Reports, May 12, 2015, 5:09734, pp. 1-11.
Lu, L. et al., "Grain growth and strain release in nanocrystalline copper," Journal of Applied Physics, vol. 89, Issue 11, pp. 6408.
Luo, Ying, "Slurry Chemistry Effects on Copper Chemical Mechanical Planarization," University of Central Florida Stars, Electronic Theses and Disserations, 2004, Paper 36, 111 pages.
Matsuzawa et al., "Room-temperature interconnection of electroplated Au microbump by means of surface activated bonding method," Electornic Components and Technology Confererence, 2001, 51st Proceedings, IEEE, pp. 384-387.
Monsma et al., "Development of the spin-valve transistor," IEEE Tran. Magnet., vol. 33, No. 5, Sep. 1997, pp. 3495-3499.
Moriceau, H. et al., "Overview of recent direct wafer bonding advances and applications," Advances in Natural Sciences—Nanoscience and Nanotechnology, 2010, 11 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1 (I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Ortleb, Thomas et al., "Controlling macro and micro surface topography for a 45nm copper CMP process using a high resolution profiler," Proc. of SPIE, 2008, vol. 6922, 11 pages.
Paul, E. et al., "A model of copper CMP," J. Electrochem. Soc., 2005, vol. 152, Issue 4, pp. G322-G328.
Petition for Inter Partes Review of U.S. Pat. No. 7,485,968, IPR 2013-00381, filed Jun. 21, 2013, pp. 1-49.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Rhoades, Robert L., "The Dark Art of CMP," Future Fab International, Issue 24, 10 pages.
Roberds et al., "Low temperature, in situ, plasma activated wafer bonding," Electrochecmical Society Proceedings, 1997, vol. 97-36, pp. 598-606.
Rosales-Yeomans, D. et al., "Evaluation of pad groove designs under reduced slurry flow rate conditions during copper CMP," Journal of the Electrochemical Society, 2008, vol. 155, No. 10, pp. H812-H818.
Schmidt, Martin A., Wafer-To-Wafer Bonding for Microstructure Formation, Proceedings of the IEEE, vol. 86, No. 8, 1998, pp. 1575-1586.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shimatsu, T. et al., "Metal bonding during sputter film deposition," J. Vac. Sci. Technol. A 16(4), 1998, pp. 2125-2131.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Steinkirchner, J. et al., "Silicon wafer bonding via designed monolayers," Advanced Materials, 1995, vol. 7, No. 7, 7 pages.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, the American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, the Electrochemical Society Proceedings, vol. 93-29 (1993), pp. 71-80.
Takagi et al., "Wafer-scale room-temperature bonding between silicon and ceramic wafers by means of argon-beam surface activation," Micro Electro Mechanical Systems, 2001, MEMS 2001, the 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.

(56) References Cited

OTHER PUBLICATIONS

Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.

Tong, Q.Y. et al., "Semiconductor wafer bonding," Materials Chemistry and Physics, R25, 1999, 239 pages (exerpts).

Tong, Q.Y. et al., "Semiconductor wafer bonding: recent developments," Materials Chemistry and Physics, vol. 37, 1994, pp. 101-127.

Tong, Q.Y. et al., "Semiconductor wafer bonding: science and technology," 1999, 120 pages.

Tong, Q.Y. et al., "Semiconductor wafer bonding: science and technology," 1999, 159 pages.

Tong, Q.Y. et al., "Wafer bonding and layer splitting for microsystems," Advanced Materials, 1999, vol. 11, No. 17, pp. 1409-1425.

Topol et al., "Enabling technologies for wafer-level bonding of 3D Mems and integrated circuit structures," 2004 Electronics Components and Technology Conference, 2004 IEEE, pp. 931-938.

Tsau et al., "Fabrication process and plasticity of gold-gold thermocompression bonds," Mater. Soc. Symp. Proc. 605, 171 (1999).

Tsau, C.H. et al., "Characterization of low temperature wafer-level gold-gold thermocompression bonds," Mater. Soc. Symp. Proc. 605, 1999, pp. 171-176.

Vossen, J. et al., "Thin Film Processes II," Academic Press, 1991, 62 pages.

Vossen, J. et al., "Thin Film Processes," Academic Press, 1978, 62 pages.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Warner, K. et al., "Low-temperature oxide-bonded three-dimensional integrated circuits," IEEE International SOI Conference, Oct. 2012, pp. 123-125.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Wikipedia, "Chemical bond," URL http://en.wikipedia.org/wiki/chemical_bond, accessed on Mar. 31, 2010, 10 pages.

Wikipedia, "Van der Waals force," URL https://en.wikipedia.org/wiki/Van_der_Waals_force, originally accessed on Mar. 31, 2010, 7 pages.

Xu et al., "New Au—Al interconnect technology and its reliability by surface activated bonding," Electronic Packaging Technology Proceedings, Oct. 28-30, 2003, Shanghai, China, pp. 479-483.

Yablonovitch, E. et al., "Van der Waals bonding of GaAs on Pd leads to a permanent, solid-phase-topotaxial metallurgical bond," Appl. Phys. Lett. 59, 1991, pp. 3159-3161.

Image showing a partial cross-section of Sony IMX260 BSI image sensor from Samsung Galaxy S7; product believed to be released Mar. 2016.

Image showing a partial cross-section of Omnivision OV16B10 16MP BSI image sensor from Huawei P20 Lite Phone; product believed to be released May 2018.

Miura et al., Fluctuation mechanism of mechanical properties of electroplated-copper thin films used for three dimensional electronic modules. In 2007 International Conference on Thermal, Mechanical and Multi-Physics Simulation Experiments in Microelectronics and Micro-Systems. EuroSime. Apr. 16, 2007 (pp. 1-6).

* cited by examiner

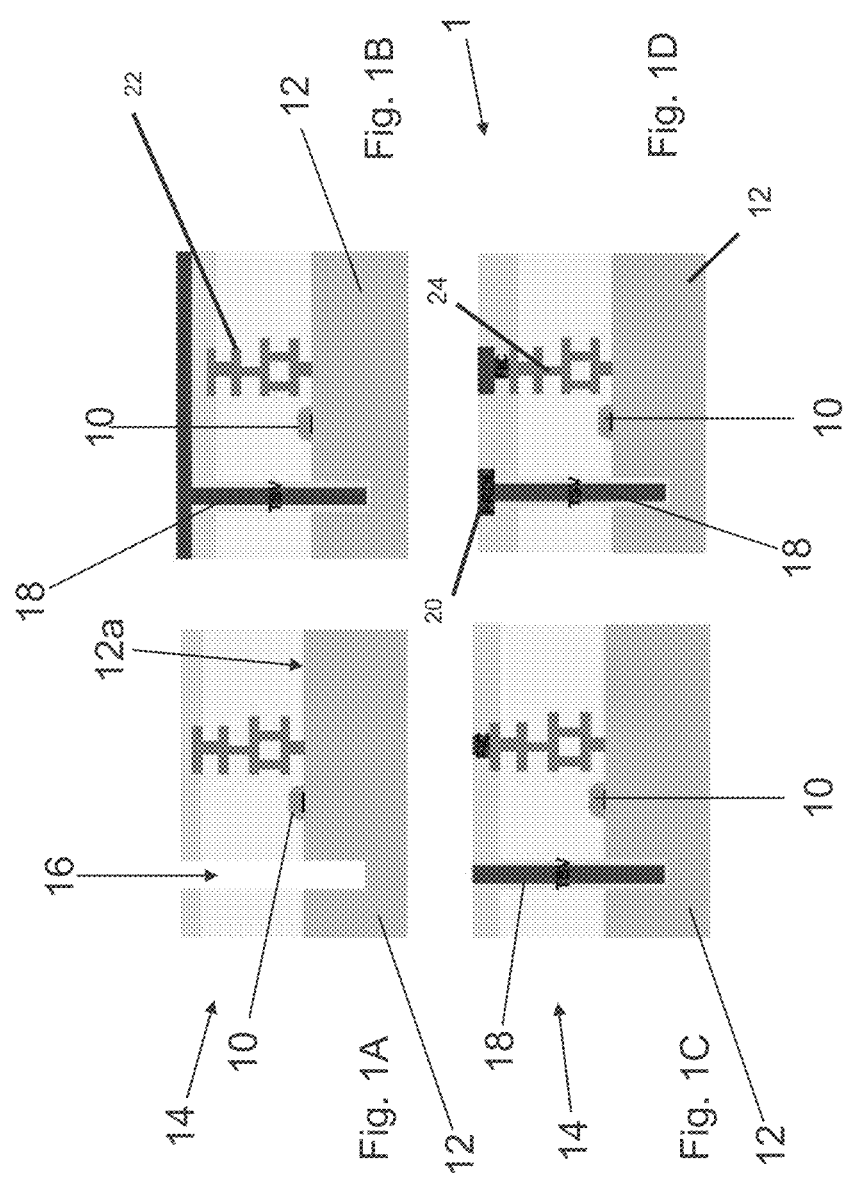

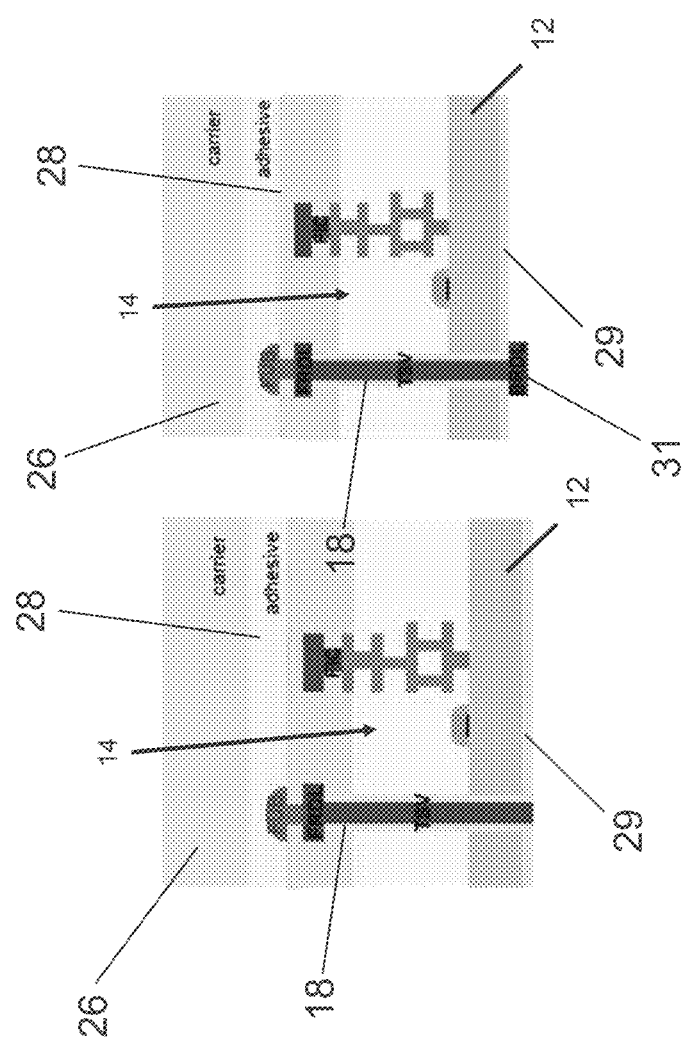

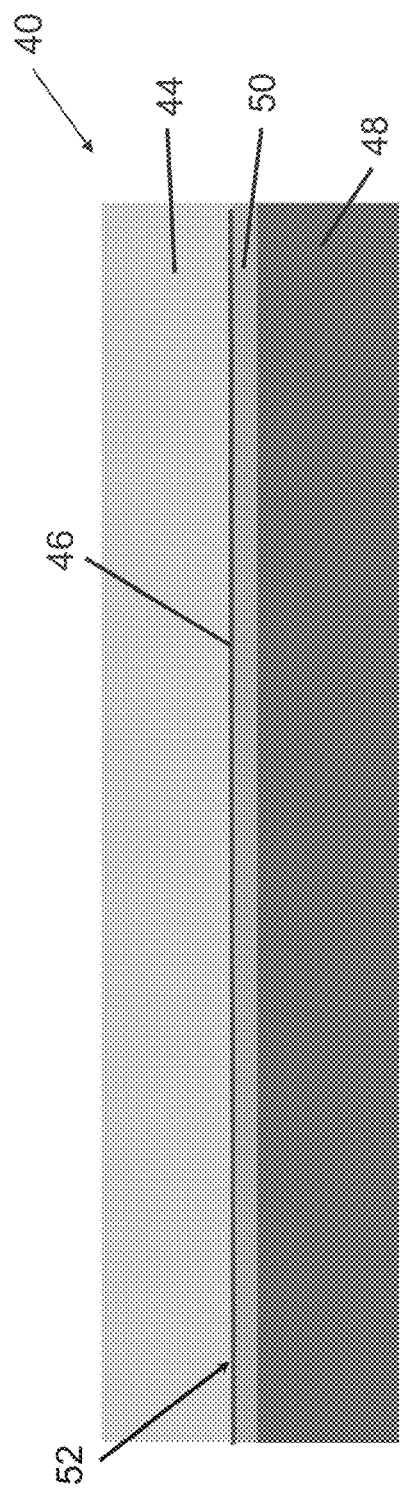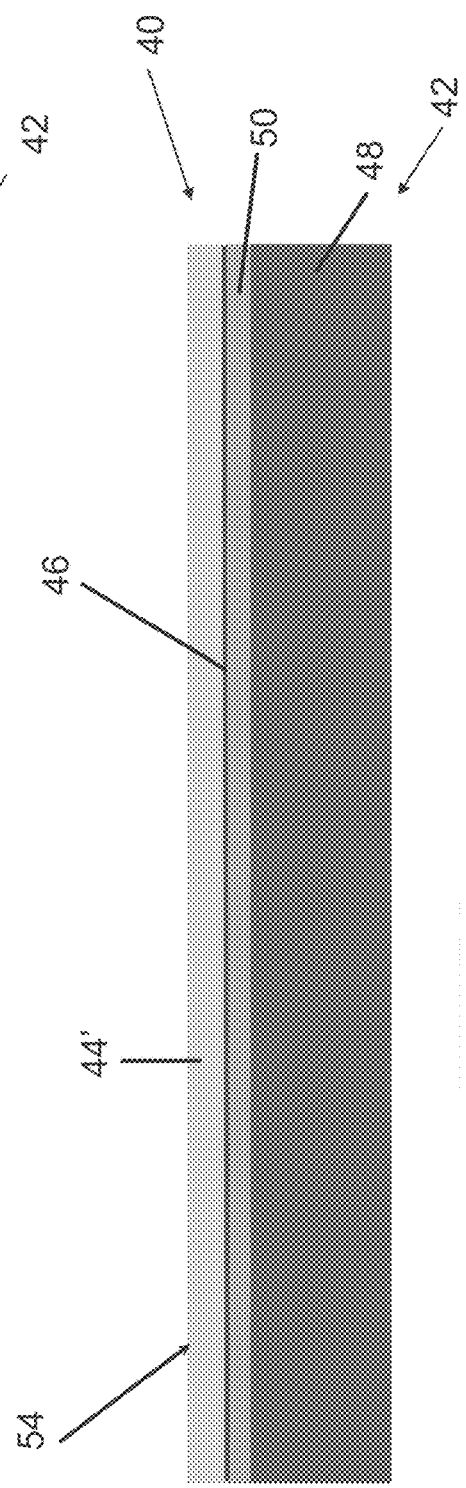

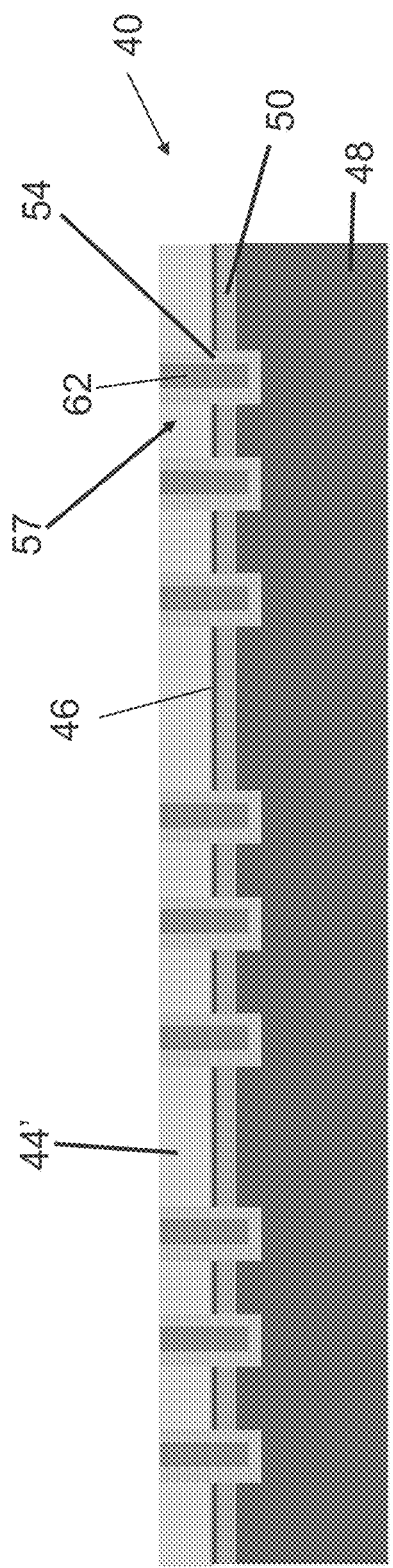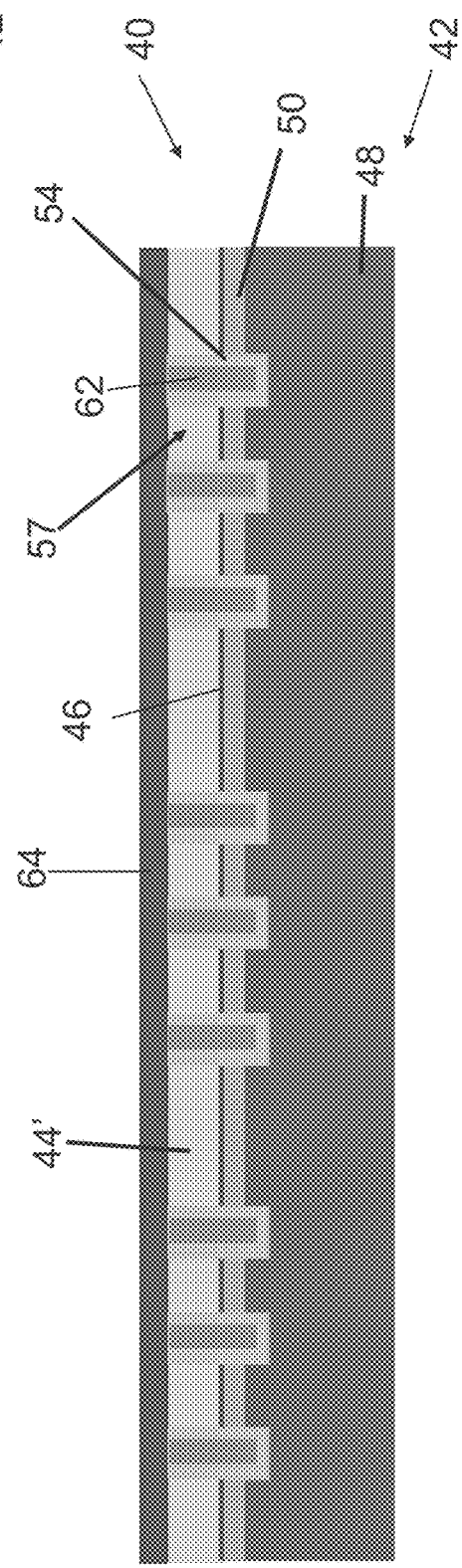

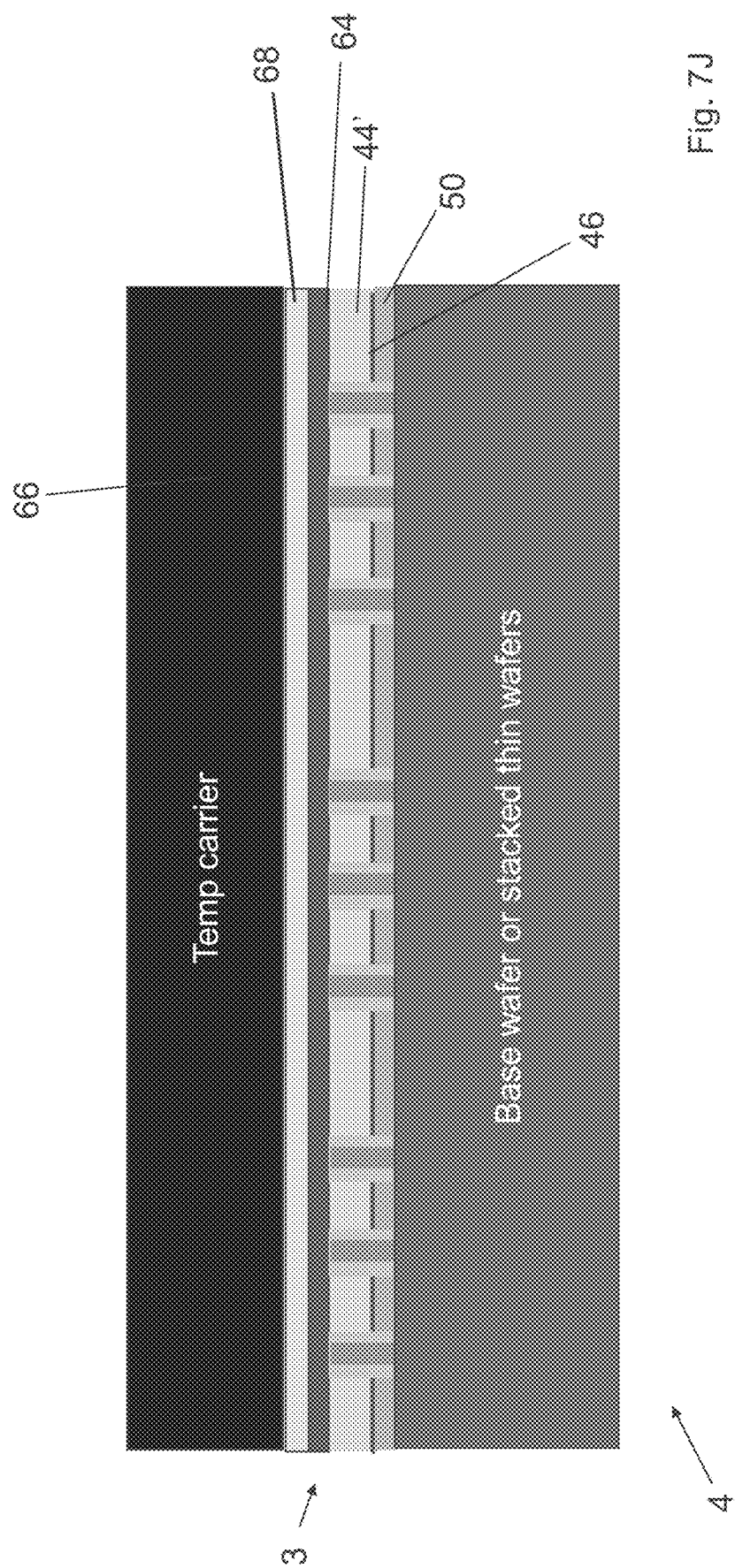

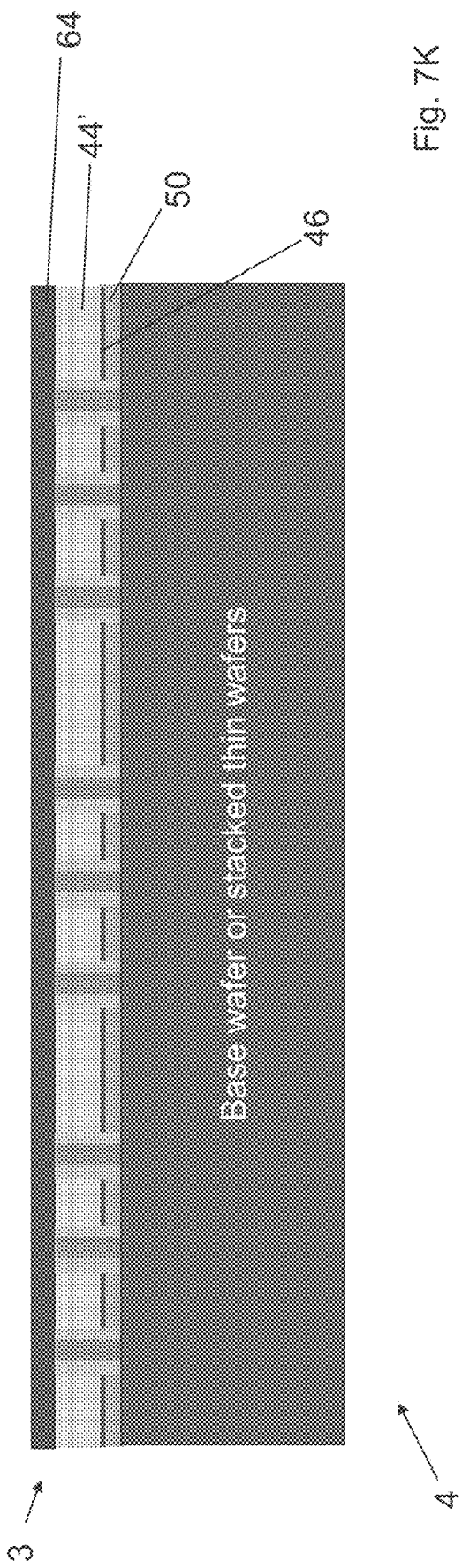

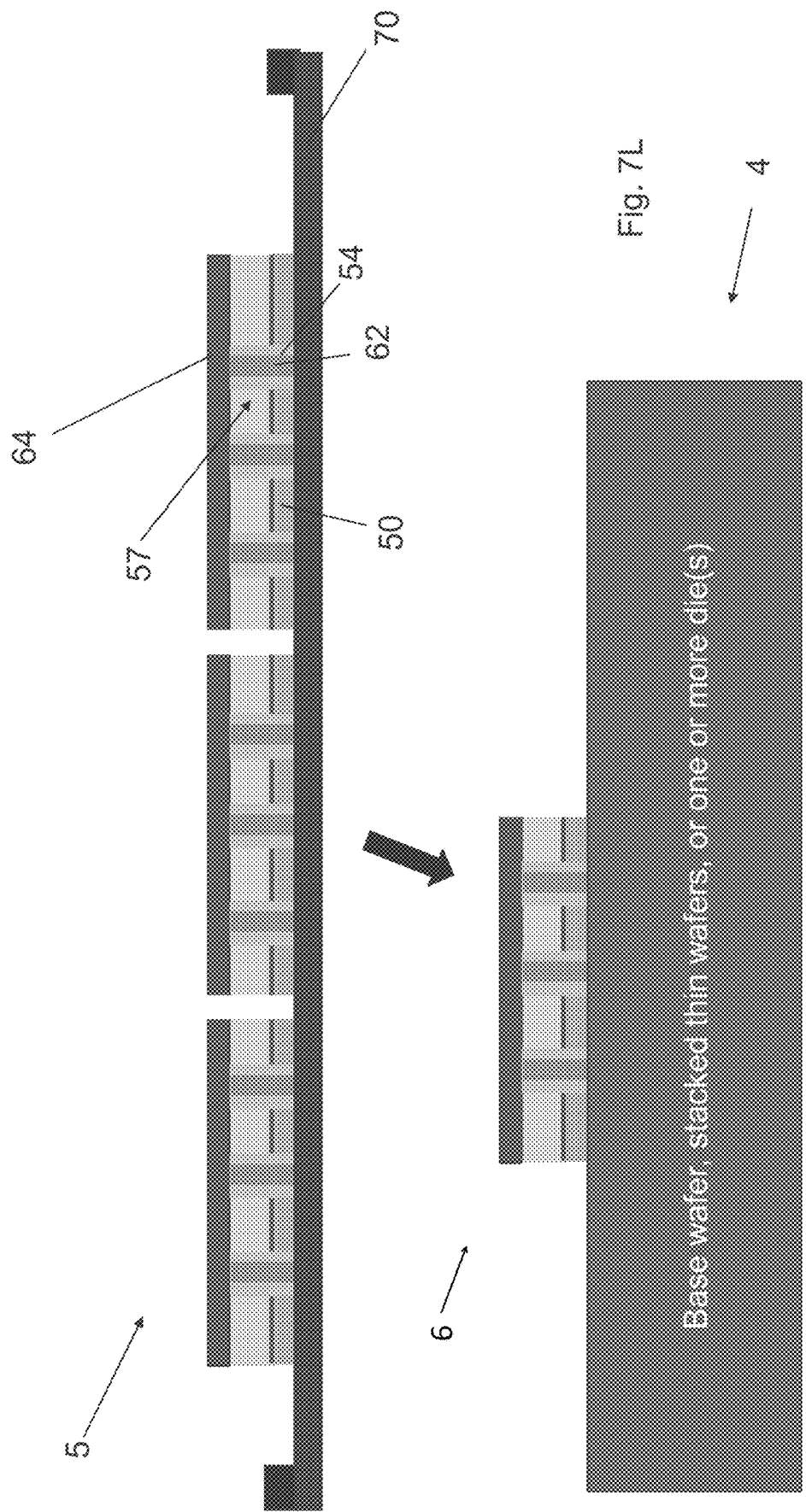

STRUCTURES WITH THROUGH-SUBSTRATE VIAS AND METHODS FOR FORMING THE SAME

CROSS-REFERENCE TO RELATED APPLICATIONS

This application claims priority to U.S. Provisional Patent Application No. 63/131,226, filed Dec. 28, 2020, titled "STRUCTURES WITH THROUGH-SUBSTRATE VIAS AND METHODS FOR FORMING THE SAME," the entire contents of each of which are hereby incorporated herein by reference.

BACKGROUND

Field

The field relates to structures with through-substrate vias and methods for forming the same.

Description of the Related Art

Semiconductor elements, such as integrated device dies or chips, may be mounted or stacked on other elements. For example, a semiconductor element can be mounted to a carrier, such as a package substrate, an interposer, a reconstituted wafer or element, etc. As another example, a semiconductor element can be stacked on top of another semiconductor element, e.g., a first integrated device die can be stacked on a second integrated device die. In some arrangements, a through-substrate via (TSV) can extend vertically through a thickness of the semiconductor element to transfer electrical signals through the semiconductor element, e.g., from a first surface of the semiconductor element to a second opposing surface of the semiconductor element. There is a continuing need for improved methods of forming TSVs.

BRIEF DESCRIPTION OF THE DRAWINGS

Specific implementations will now be described with reference to the following drawings, which are provided by way of example, and not limitation.

FIG. 1A illustrates a step in a process for forming a through-substrate via in a microelectronic structure.

FIG. 1B illustrates another step in the process for forming the through-substrate via in the microelectronic structure.

FIG. 1C illustrates another step in the process for forming the through-substrate via in the microelectronic structure.

FIG. 1D illustrates another step in the process for forming the through-substrate via in the microelectronic structure.

FIG. 1E illustrates another step in the process for forming the through-substrate via in the microelectronic structure.

FIG. 1F illustrates another step in the process for forming the through-substrate via in the microelectronic structure.

FIG. 7A illustrates a step in a method for forming a microelectronic structure, according to an embodiment.

FIG. 7B illustrates another step in the method for forming the microelectronic structure.

FIG. 7E illustrates another step in the method for forming the microelectronic structure.

FIG. 7F illustrates another step in the method for forming the microelectronic structure.

FIG. 7J illustrates the microelectronic structure bonded to a wafer.

FIG. 7K illustrates the microelectronic structure bonded to the wafer after removal of the carrier.

FIG. 7L illustrates singulated elements mounted to another element.

DETAILED DESCRIPTION

Figure 2:
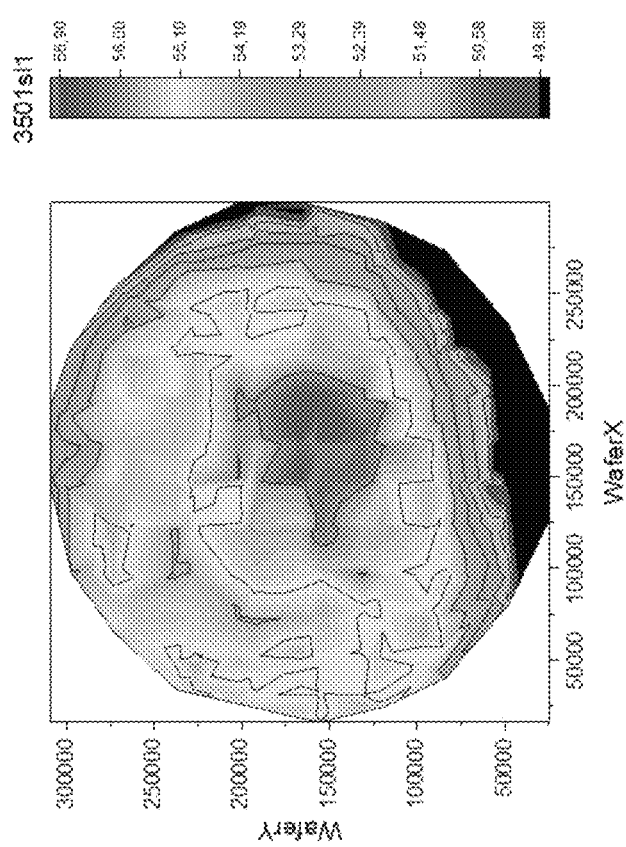
FIG. 2 shows heights of vias formed at different locations of a 12 inch wafer.

FIGS. 1A to 1F illustrates various conventional processing steps for forming TSVs in a microelectronic structure 1. In FIGS. 1A to 1F, the microelectronic structure comprises a portion of a semiconductor wafer (a bulk semiconductor portion 12). The illustrated via structures comprise via-middle structures, in which active circuitry 10 (e.g., transistors or other active circuit elements) can be formed on or in an active surface 12a of a bulk semiconductor portion 12, one or more insulating layers 14 can be formed over the active circuitry 10, and an opening 16 for a through-substrate via (TSV) can be formed through the one or more insulating layers 14 and a portion of the bulk semiconductor portion 12 (see FIG. 1A). A via structure 18 can be provided in the opening 16 as shown in FIGS. 1B and 1C. Conductive overburden from electroplating the via structure 108 in FIG. 1B can be removed (e.g., polished away) in FIG. 1C. As shown in FIG. 1D, a conductive pad 20 can be provided over the one or more insulating layers 14 and electrically connected to the via structure 18. The conductive pad 20 can be configured to electrically connect to another element. For example, the conductive pad 20 can be a front side interconnect contact (FIC) or a front side redistribution layer (FRDL). Contact pads 20 of the microelectronic structure 1 (a first element) can be directly bonded to contact pads of a second element. As shown in FIG. 1B, in some arrangements, a metallization layer 22 (e.g., a back-end-of line (BEOL) or redistribution layer (RDL)) can be provided over or within the one or more insulating layer(s) 14. The metallization layers 22 can be connected by conductive interconnects 24. As explained herein, in various embodiments, the microelectronic structure 1 (e.g., the first element) can be directly bonded to the second element without an intervening adhesive. An insulating bonding layer of the first element can be directly bonded to an insulating bonding layer of the second element. Any suitable number of elements can be stacked and directly bonded to one another.

As shown in FIGS. 1E and 1F, a frontside of the microelectronic structure 1 can be attached to a carrier 26 by way of an adhesive 28. The carrier 26 can comprise a temporary handle wafer that is used to support the microelectronic structure 1 during processing, such as back grinding. The adhesive 28 can comprise an organic adhesive in some embodiments, and can be sensitive to high temperatures. Accordingly, the use of the adhesive 28 to attach the carrier 26 to the microelectronic structure 1 may limit the temperatures that can be applied during processing. In other embodiments, however, the carrier 26 can be directly bonded to the frontside of the microelectronic structure 1 without an adhesive 28. While the frontside (e.g., a second surface) is attached to the carrier 26, the backside (e.g., a first surface) of the semiconductor portion 12 can be grinded down to expose the via structure 18. As shown in FIG. 1F, a dielectric layer 29 may be deposited on the back side surface of the semiconductor portion 12. A backside metallization layer 31, for instance, a redistribution layer (RDL), can be provided over the dielectric layer 29 and can be configured to electrically connect to the via structure 18.

The conventional via formation process has several problems that lead to non-uniform via lengths. For example, the etch process used to form the openings for the vias is non-uniform across the substrate (e.g., wafer), particularly for the high aspect ratio openings used for vias, which leads to via openings having different depths. Indeed, as shown in FIG. 2, for a 12 inch wafer, the etch process that is used to form the via openings can have a non-uniformity of approximately 7 microns. In some areas of the wafer, the etch depth will be higher, while some areas of the wafer with have low etch depths, other areas of the wafer will have etch depths between the low and high etch depts. The varying depth of the etched via openings accordingly leads to different via structure lengths once the conductive material (e.g., copper) is filled into the openings. The selectively etched TSV cavities can be lined with a dielectric layer, the surface of the dielectric liner can be coated with a suitable barrier or adhesion layer prior to filling the cavity with the conductive layer, e.g., copper.

Figure 4:
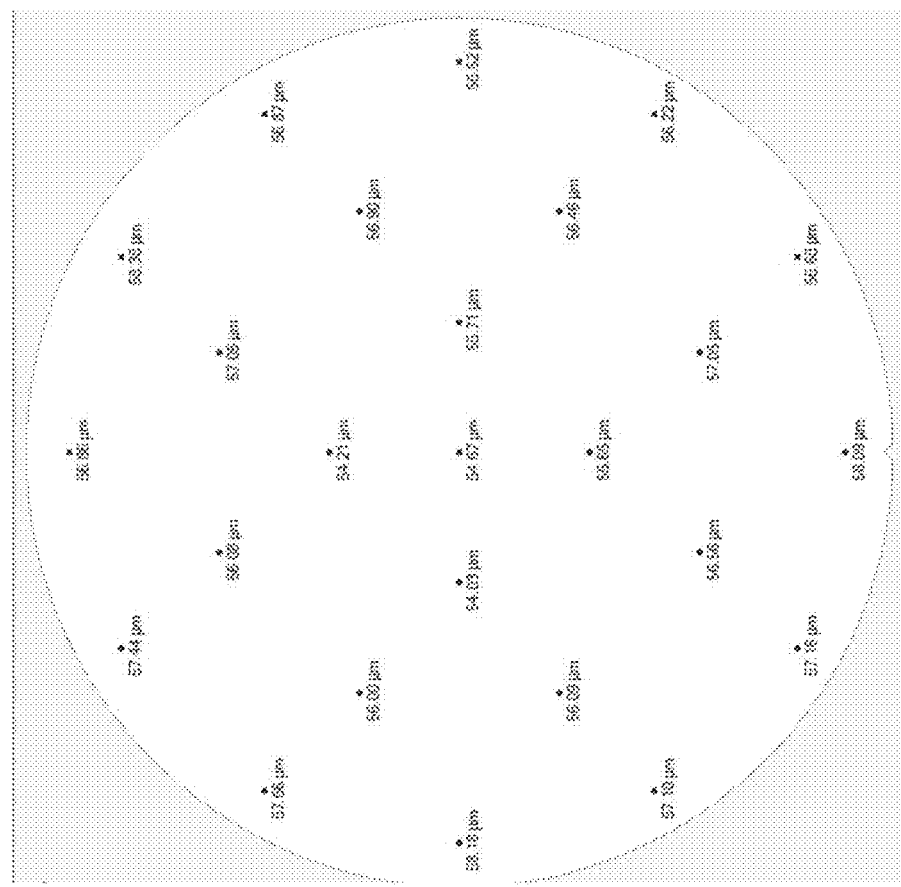
FIG. 4 is a distribution map showing thickness variations on an 8 inch wafer after TSV planarization.
Figure 3:
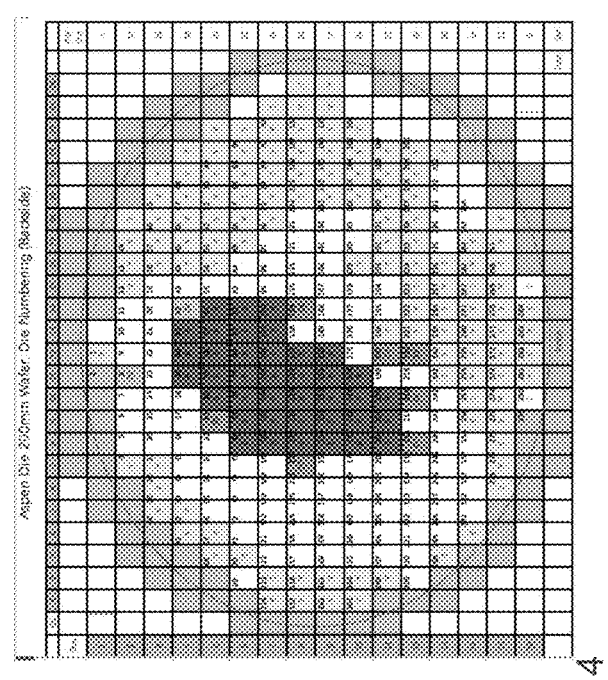
FIG. 3 is a wafer distribution map after TSV reveal for an 8 inch wafer showing vias with lengths that are too long and vias with lengths that are too short.

FIG. 3 is a wafer distribution map after TSV reveal for an 8 inch wafer showing vias with lengths that are too long and vias with lengths that are too short. A too long via is a via with a length that is more than a desired or predetermined length range, and a too short via is a via with a length that is less than optimized desired or predetermined length range. FIG. 4 is a distribution map showing thickness variation (4 μm variation) on an 8 inch wafer after TSV planarization. As shown in FIGS. 3 and 4, the different via lengths can lead to a significant loss in yield. For instance, dies that have TSVs that are too short to be fully revealed or effective, and dies that have TSVs that are too long to fracture during TSV planarization or cannot be used. For example, some dies within the wafer may have TSVs that are too short to be effectively used in the die. Other vias are too long or break off during grinding or polishing, leaving the vias buried in the semiconductor portion of the device, making it relatively difficult to forming a backside interconnection to a pad or RDL. Additionally, in some processes, non-uniform TSVs may result from incomplete or non-uniform plating procedures. For example, in such processes, the via openings may be etched uniformly, but the plating process through the high aspect ratio openings may not uniformly fill the via openings. This process variation reduces the number of dies that are effective. Accordingly, non-uniform TSV lengths may result from a variety of different processing methods.

FIG. 4 illustrates the thickness variation on an 8" wafer that can be measured after TSV planarization. As can be seen, the thickness of the wafer can vary by 4 microns. Some regions of the wafer can have a thickness of up to 58.09 microns, while other regions of the wafer can have a thickness of 56.09 microns, while other regions of the wafer can have lower thicknesses around 54.67 microns. Wafer thickness variation can also cause some TSVs to be rendered ineffective and lead to lower levels of process control.

As explained above, due to, e.g., die thickness non-uniformity and TSV opening etch non-uniformity, the lengths of the TSVs may vary considerably across the wafer after grinding the backside of the semiconductor portion to reveal the TSVs. Accordingly, as the backside of the bulk semiconductor portion is grinded or otherwise thinned, the exposed vias may protrude from the backside of the thinned semiconductor portion by varying lengths (and some vias, as explained above, may remain unexposed and buried in the semiconductor portion). To reduce the non-uniform lengths of the TSVs while preventing breakage of the protruding TSVs, one or more backside dielectric layers can be provided over the backside of the semiconductor portion and over the TSVs. While it may be possible to employ solder bumping despite some degree of TSV height (protrusion from the backside) variability, the variability leads to a lack of levelness and makes stacking difficult. Some stacking technologies (such as direct hybrid bonding) are especially sensitive to topographical variations.

In conventional TSV processing of the type shown in FIGS. 1A-1F, one or more backside dielectric layers 29 can be provided over the backside of the semiconductor portion 12 and over the revealed TSVs. For example, in some processes, a barrier layer (e.g., a dielectric barrier layer, such as silicon nitride, silicon oxynitride, silicon carbonitride, diamond-like carbon, etc.) can be deposited over the backside of the semiconductor portion 12, over a sidewall of the exposed TSVs, and over the exposed end surfaces of the exposed TSVs. A second dielectric layer (such as silicon oxide or any other suitable dielectric) can be deposited over the dielectric barrier layer, including over the upper surface of the barrier layer, over the portion of the barrier layer that extends along the sidewall of the exposed TSVs, and over the portion of the barrier layer that is disposed along the end surface of the exposed TSVs. After depositing the backside dielectric layer(s), the vias and portion(s) of the dielectric layer(s) can be grinded or polished (or otherwise removed) to planarize the vias and reduce non-uniformities.

Figure 8B:
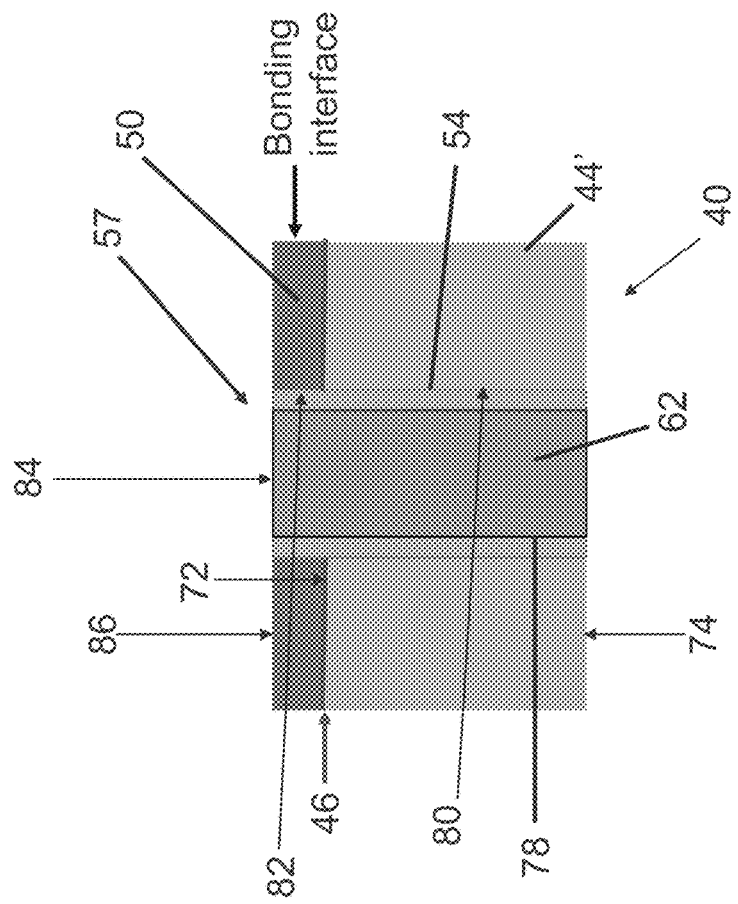
FIG. 8B is a cross sectional view of a via structure, according to an embodiment.
Figure 8A:
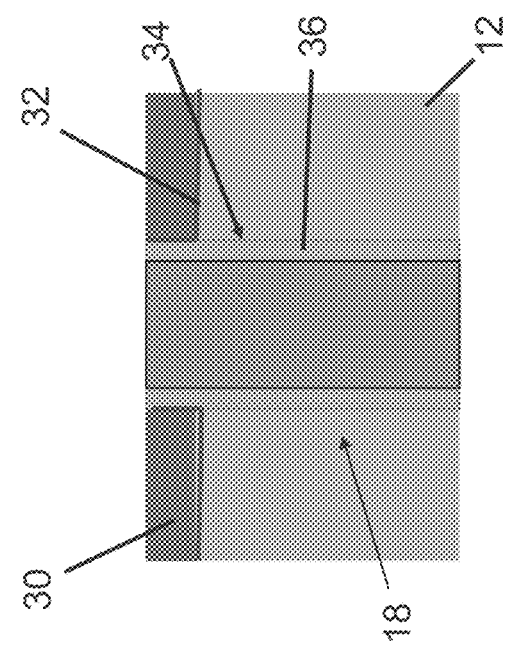
FIG. 8A is a cross sectional view of a via structure.

As an example, FIG. 8A illustrates a via structure 18 that is formed using a conventional via-middle or via-last process after grinding or polishing the via structure 18, a portion of a dielectric layer 30 (e.g., a Low Temperature Oxide (LTO) layer), and a portion of a dielectric barrier layer 32 (e.g., a copper (Cu) diffusion barrier layer). For example, the LTO deposition process may involves depositing a dielectric layer using a silane such as, for example, tetraethoxysilane (TEOS), at a temperature of 200° C. or less. As opposed to the LTO, a High Temperature Oxide (HTO) layer can have a higher stable temperature. The HTO layer may be capable of being deposited at a temperature greater than 200° C. In some embodiments, the HTO layer may be capable of being deposited at a temperature of 250° C. or greater. In some embodiments, the HTO layer be capable of being deposited at a temperature of 300° C. or greater, or 350° C. or greater. For example, the HTO can comprise a 400° C. TEOS. In FIG. 8A, the dielectric barrier layer 32 extends on the thinned backside of the bulk semiconductor portion and along a sidewall 34 of the conductive via structure 18 (e.g., along a sidewall of a dielectric liner 36). The dielectric layer 30 is disposed on the dielectric barrier layer 32 (for example a SixOyNz layer) and terminates at the portion of the dielectric barrier layer 32 extending along the sidewall 34 of the via structure 18. In the structure shown in FIG. 8A, the dielectric layer 30 does not contact the dielectric liner 36 of the via structure 18.

Figure 5:
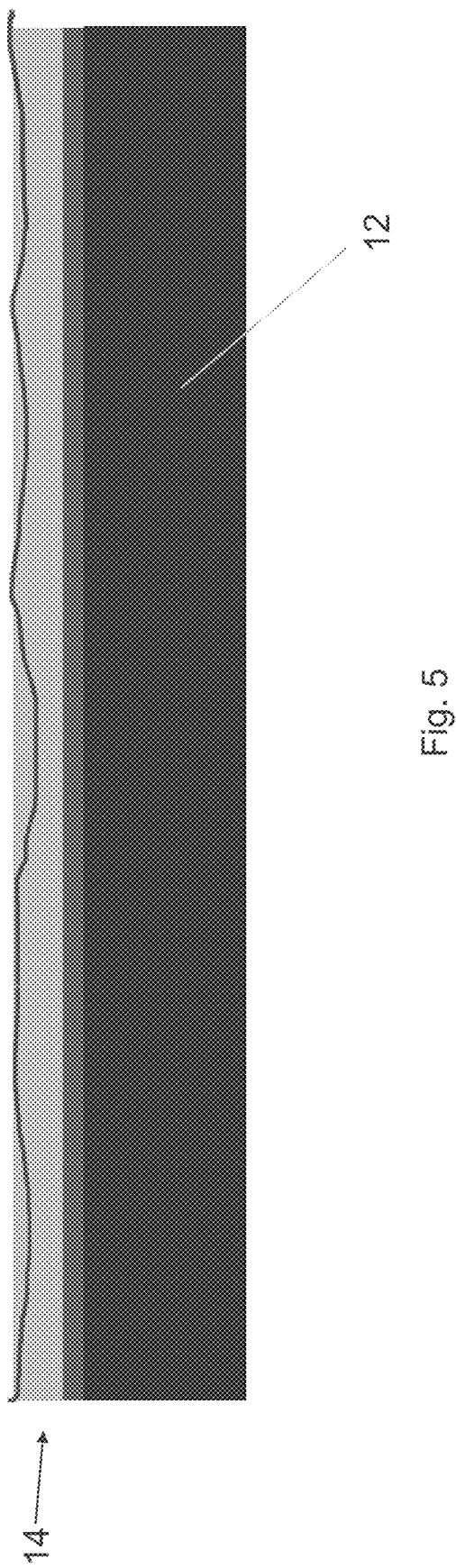
FIG. 5 is a schematic cross sectional side view of a structure having surface non-uniformity.

In conventional processes, the dielectric layer 30 (and the dielectric barrier layer 32) can be deposited using a suitable deposition process (e.g., plasma-enhanced chemical vapor deposition (PE-CVD) process). However, as explained above, the adhesive used to attach the temporary carrier to the microelectronic device is typically still in place during the dielectric depositions, and is typically sensitive to high temperature processing. Accordingly, in conventional processes, the backside dielectric layers (which can comprise barrier materials like silicon nitride and lower k materials like silicon oxide in some arrangements) are generally deposited at low temperature, e.g., at temperatures less than 200° C., or less than 300° C. Deposition of the dielectric layer 30 at low temperatures may form a low quality, low temperature silicon oxide layer. Indeed, voids may grow rapidly within the low temperature oxide (LTO) layer as the device is subsequently annealed, such as at 200° C. and above. Low quality dielectric layers may be problematic for some applications, such as direct bonding processes. The presence of voids may render the dielectric surfaces unsuitable for subsequent processing, such as direct bonding. Further, as shown in FIG. 5, the non-uniformity of wafer or die thicknesses can accumulate on the bonding surface, such that additional layers deposited on the element may exacerbate the non-uniformity. When multiple elements are stacked (e.g., directly bonded), the non-uniformity of thicknesses can negatively affect flatness and reduce bonding effectiveness in wafer-to-wafer (W2 W) and die-to-wafer (D2 W) applications, and can similarly negatively affect transfer or lamination of additional device layers.

Figure 6:
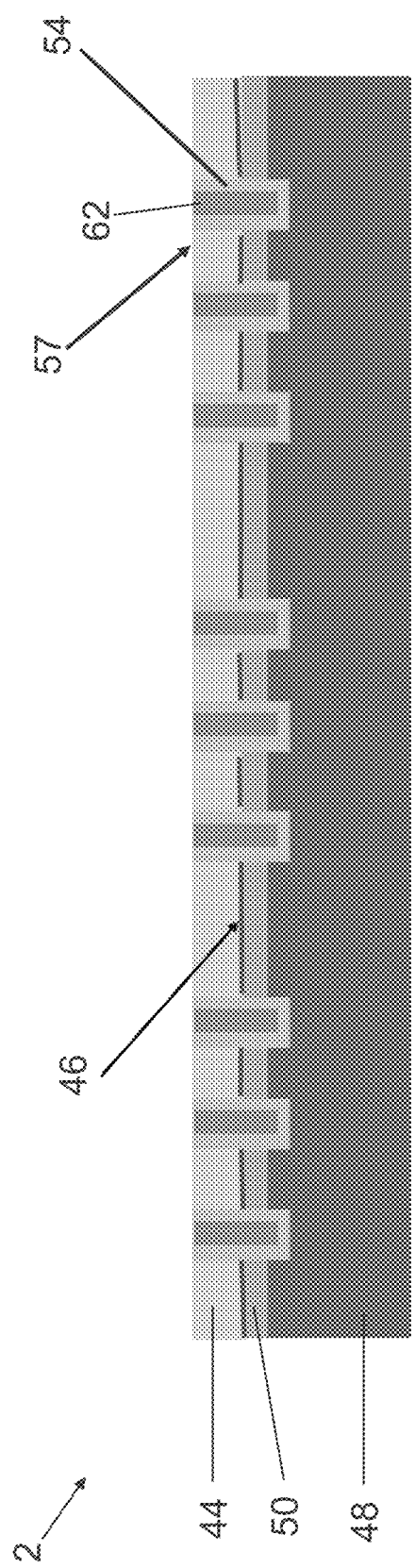
FIG. 6 is a schematic cross sectional side view of a microelectronic structure, according to an embodiment.

Various embodiments disclosed herein address the challenges in via formation and direct bonding due to via opening etch non-uniformity, die or wafer thickness non-uniformity, and backside dielectric layer quality. FIG. 6 is a schematic cross sectional side view of a microelectronic structure 2, according to an embodiment. As shown in FIG. 6, the backside dielectric layer can be formed before TSV reveal as an embedded layer 50 between two elements 44, 48 (e.g., two semiconductor elements). The disclosed embodiments can provide better TSV depth uniformity and better wafer or die thickness uniformity. Moreover, instead of depositing low quality LTO as the backside dielectric layer, the disclosed embodiments enable the use of high quality high temperature oxide (HTO) layer(s) as the backside dielectric layer, because it is formed well before the low temperature adhesive is employed for carrier attachment. The use of HTO as the dielectric layer can beneficially be used in applications in which a LTO layer would be undesirable, such as direct bonding applications.

Figure 7C:
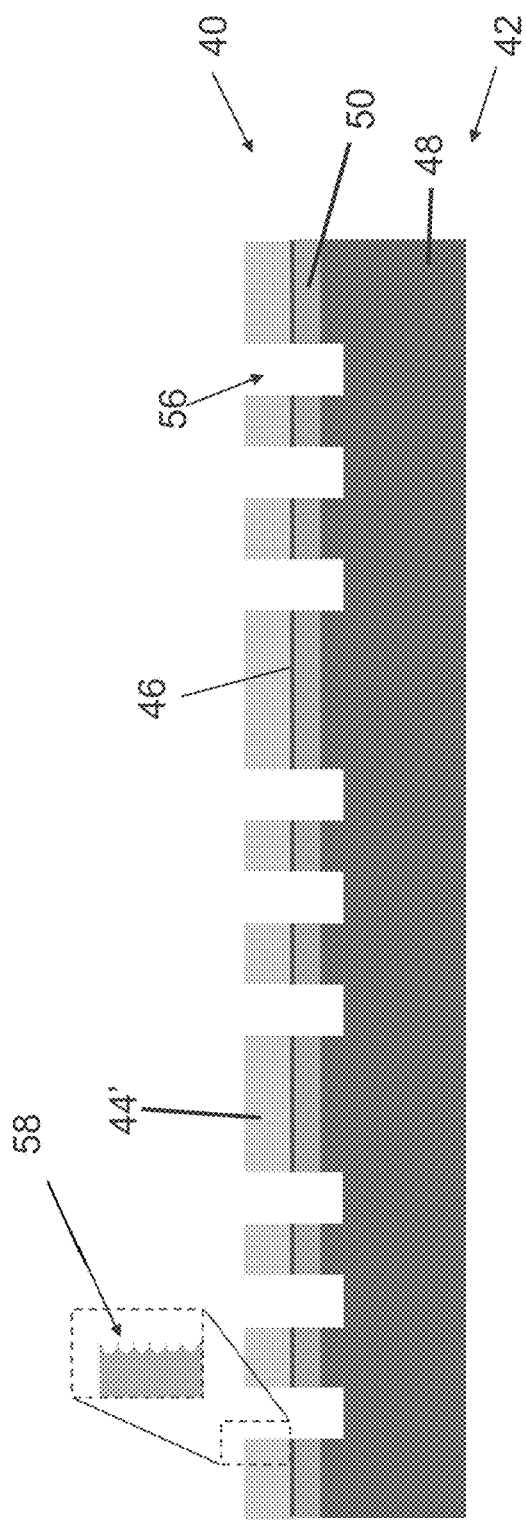
FIG. 7C illustrates another step in the method for forming the microelectronic structure.

FIGS. 7A-7L illustrate a method for forming a microelectronic structure 3 (see FIGS. 7I-7K), according to various embodiments. FIG. 7A is a schematic cross sectional side view showing a first element 40 and a second element 42 bonded to the first element 40. A bulk semiconductor portion 44 of the first element 40 and the bulk semiconductor portion 48 of the second element 42 can be intervened by a first dielectric barrier layer 46 and a second dielectric 50. As shown in FIG. 7A, a semiconductor substrate (the bulk semiconductor portion 44 of the first element 40 or the bulk semiconductor portion 48 of the second element 42) is provided with an embedded dielectric layer (the second dielectric layer 50). For example, any of several silicon-on-insulator (SOI) processes can be employed to provide the embedded dielectric layer (the second dielectric layer 50). In one example, the first element 40 (e.g., a first semiconductor element) can be directly bonded to the second element 42 (e.g., a second semiconductor element) without an intervening adhesive along a bond interface 52. In some embodiments, the bond interface 52 can be within the second dielectric layer 50. As explained in more detail below, nonconductive bonding surfaces of the first and second elements 40, 42 can be prepared for direct bonding. For example, the nonconductive or dielectric bonding surfaces can be polished to a high degree of smoothness, and activated and/or terminated with a suitable species. The first and second elements can be brought into direct contact, and the nonconductive bonding surfaces of the first and second elements can form direct covalent bonds without an intervening adhesive.

One or more embedded dielectric layer(s) can be provided along the bond interface between the first and second elements. As shown in FIG. 7A, the first dielectric barrier layer 46 can be provided (e.g., deposited) on the bulk semiconductor portion 48 of the second element 42. The first dielectric barrier layer 46 can comprise any suitable barrier layer that prevents or reduces diffusion of conductive material (e.g., copper), such as silicon nitride, silicon carbide, silicon oxynitride, silicon carbonitride, diamond-like carbon, etc. The second dielectric layer 50 can be provided on the bulk semiconductor portion 48 of the second element 42 between the first dielectric barrier layer 46 and the bulk semiconductor portion 48 of the second element 42. The second dielectric layer 50 can comprise a high temperature silicon oxide (HTO) material in some embodiments. In some embodiments, the second dielectric layer 50 can comprise silicon oxynitride (SiON) or silicon oxycarbonitride (SiOCN). For example, the second dielectric layer 50 can comprise SiO2, SiNx, or SiCNO.

In some embodiments, the second dielectric layer 50 can be provided on the second element 42, and the second dielectric layer 50 of the second element 42 can be directly bonded to the bulk semiconductor portion 44 of the first element 40. In such an embodiment, the bond interface 52 can lie along the interface between the embedded dielectric layer (the second dielectric layer 50) and the first element 40. In other embodiments, the second dielectric layer 50 can be provided on the first element 40, and the second dielectric layer 50 of the first element 40 can be directly bonded to the bulk semiconductor portion 48 of the second element 42. In such an embodiment, the bond interface can lie along the interface between the embedded dielectric layer (the second dielectric layer 50) and the second element 42. In still other embodiments, a first portion of the embedded dielectric layer (the second dielectric layer 50) can be provided on the first element 40, and a second portion of the embedded dielectric layer (the second dielectric layer 50) can be provided on the second element 42, the first and second portions of the embedded dielectric layer (the second dielectric layer 50) can be directly bonded to one another. In such an embodiment, the bond interface can extend in the interior of the embedded dielectric layer (the second dielectric layer 50) between the first and second portions. The embedded dielectric layer (the second dielectric layer 50) can have a thickness in a range of 0.5 microns to 3 microns, or in a range of 1 micron to 2 microns. The thickness of the embedded dielectric layer can be chosen to balance stresses with the back end of line (BEOL) dielectrics designed to be formed on the opposite side of the first element.

Because the embedded dielectric layer (the second dielectric layer 50) is formed before attachment to a carrier, high temperature deposition processes can be used to deposit the dielectric layer on the first and/or second elements 40, 42. For example, in some embodiments, the embedded dielectric layer (the second dielectric layer 50) can comprise a high temperature oxide (HTO) dielectric layer that has superior qualities as compared to the LTO layer used in conventional techniques. The HTO layer may have fewer defects when heated to temperatures greater than 300° C. or greater than 350° C. In some embodiments, the HTO layer can have a relatively low level of hydrogen in the form of SiH or OH bonds, as compared to LTO layers. For example, an LTO layer can have a hydrogen content of at least 5% or at least 10%. Further the LTO layer can be porous and can absorb moisture. The presence of hydrogen and/or moisture can diffuse to the bond interface 52 during annealing and cause the formation of voids in LTO layers. Moreover, a density of the LTO film can typically be lower such that polish rates and etch rates may be higher than an HTO layer by about 10% to 20%. Beneficially, the HTO layer used in the disclosed embodiments can have a higher density than an LTO layer, which can accommodate faster polish and etch rates. Moreover, the HTO layer can have a hydrogen content of less than 5%, less than 3%, or less than 1% in various embodiments. In various embodiments, the HTO can be chemically stable at temperatures above, for example 200° C., above 300° C., or above 400° C. In other embodiments, the dielectric film (e.g., the second dielectric layer 50) may be formed at low temperature and or with unique deposition processes to obtain high quality dielectric with, for example, Si, O, N, C. With the flexibility to deposit the dielectric layer first, the composition of the film may be designed for improved performance for a variety of factors including diffusion resistance to metals, etch selectivity, thermal conductivity. This dielectric layer (the second dielectric layer 50) may be engineered to optimize the property for the specific application. In some embodiments, the second dielectric layer 50 can be deposited or grown. The second dielectric layer 50 can comprise thermal oxide created by annealing, for example. In some embodiments, the second dielectric layer 50 can comprise a relatively thin native oxide, such as about 1 nm thick native oxide. The surface can be treated to grow the oxide thicker to form thermal oxide with, for example, a thickness in a rage of 300 nm to 500 nm. For example the surface can be annealed in the presence of oxygen and/or moisture.

Turning to FIG. 7B, the bulk semiconductor portion 44 of the first element 40 can be thinned (e.g., grinded and/or polished) to form a thinned bulk semiconductor portion 44'. A surface of the thinned bulk semiconductor portion 44' can serve as an active front surface 54 of the device (the first element 40) in some embodiments. Active integrated circuitry, such as transistors, etc. (not shown) can be formed in or on the active surface 54, and BEOL metallization layers thereover, either before or after TSV formation shown in FIGS. 7C-7E.

In FIG. 7C, a multi-step etch recipe can be used to controllably form openings 56 for via structures 57 (see FIGS. 7E-7L). In a first step, a first plasma etch chemistry can be used to etch through the bulk semiconductor portion 44' of the first element 40 (which can comprise silicon in some embodiments). The first etch chemistry can have high etch selectivity (e.g., about 60:1) between the bulk semiconductor portion 44' (e.g., silicon) and embedded dielectric layer (e.g, the first dielectric barrier 46 layer which can comprise silicon oxide). For example, in some embodiments, a Bosch etch procedure (which can use, e.g., $SF_6$ as an etchant) can be used to selectively and controllably form the openings 56 entirely through the silicon bulk semiconductor portion 44'. Due to the Bosch etch process, a first sidewall of the bulk semiconductor portion adjacent the via structure 57 in the first element can have first artifacts indicative of the first etching process. For example, the first etch process (e.g., the Bosch etch) can leave first artifacts having ridges 58 that leave a surface roughness profile along the first sidewall of the bulk semiconductor portion. Because of the high etch selectivity, the embedded dielectric layer(s) (e.g., the first dielectric barrier layer 46) can serve as an etch stop layer to prevent over-etching into the second dielectric layer 50 and/or the bulk semiconductor portion 48 of the underlying second element 42.

A second etch step can include a second etch chemistry (e.g., a dielectric etch chemistry) that etches through the first dielectric barrier layer 46, the second dielectric layer 50 (e.g., silicon oxide), and into a portion of the bulk semiconductor portion 48 (e.g., silicon) of the second semiconductor element 42. The second etch chemistry can accordingly etch completely through the first and second dielectric layers 46, 50, and into the bulk semiconductor portion 48 of the second element 42 by a controllable amount. The second etch can form second artifacts along the sidewalls of the first dielectric layer 46, the second dielectric barrier layer 50, and the bulk semiconductor portion 48 of the second element 42. The second artifacts can be visually different from the first artifacts upon inspection with optical imaging techniques. For example, the surface roughness of the second artifacts can differ from the surface roughness of the first artifacts. In one embodiment, the surface roughness of the second artifacts can be lower (e.g., smoother) than the surface roughness of the first artifacts.

The second etch can etch into the bulk semiconductor portion 48 of the second element 42 by a depth less than 5 microns, less than 3 microns, or less than 1 micron, e.g., in a range of 0.05 microns to 5 microns, in a range of 0.05 microns to 3 microns, in a range of 0.05 microns to 1 micron, in a range of 0.05 microns to 0.5 microns, in a range of 0.25 microns to 5 microns, in a range of 0.25 microns to 3 microns, in a range of 0.25 microns to 1 micron, or in a range of 0.5 microns to 1 micron. Because the via etch proceeds through only a reduced (thinned) thickness of the first element 40, and because a selective etch has been performed through the remaining semiconductor bulk thickness to stop on the embedded dielectric (the first dielectric layer 46 and the second dielectric barrier layer 50), and because etch depth into the bulk semiconductor portion 48 of the second element 42 is so small compared to the overall thickness of the die, etch uniformity can be controlled to a uniformity of approximately less than 1 micron.

Figure 7D:
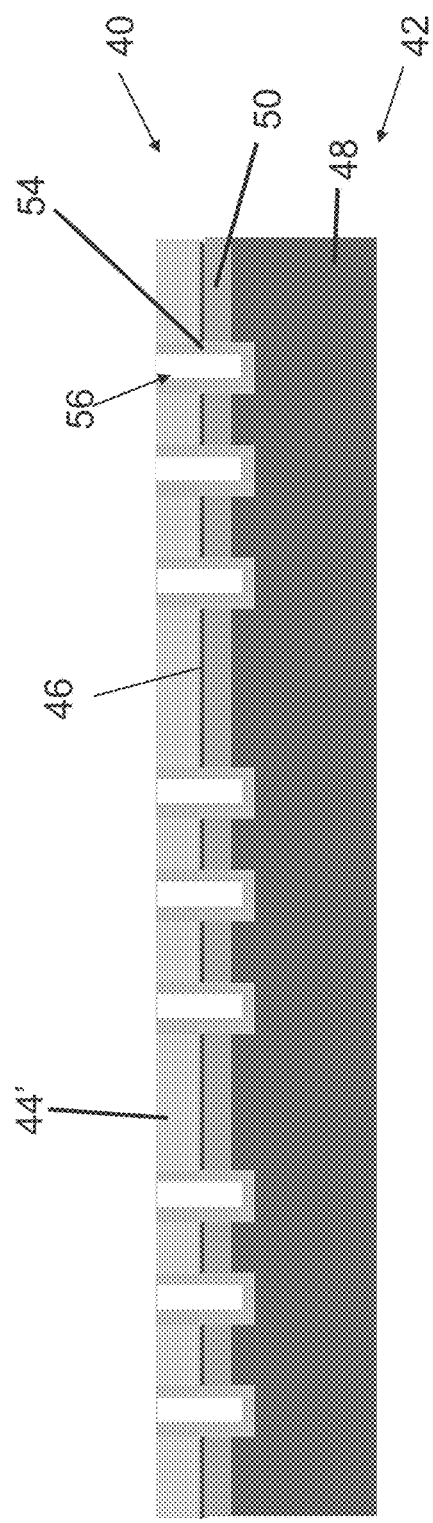
FIG. 7D illustrates another step in the method for forming the microelectronic structure.

Turning to FIG. 7D, a dielectric liner layer 54 of the via structure 57 can be provided in the openings 56 along the sidewall of the bulk semiconductor portion 44' of the first element 40, along the sidewalls of the first dielectric barrier layer 46 and the second dielectric layer 50, and along the sidewall of the bulk semiconductor portion 48 of the second element 42. The dielectric liner layer 54 can comprise any suitable dielectric, such as silicon oxide, silicon nitride, etc. A barrier layer (not shown) can be provided in the opening 56 on the dielectric liner layer 54. The barrier layer can comprise a conductive barrier layer in some embodiments to prevent or reduce migration of the conductive material (such as copper). The conductive barrier layer of the via structure 57 can comprise, for example, a metal or metal nitride, such as titanium nitride, tantalum nitride, or any other suitable barrier layer.

Turning to FIG. 7E, a seed layer (not shown) can be provided over the semiconductor portion of the first element 40 and into the openings 56 over the barrier layer in the openings 56. Conductive vias 62 (e.g., copper) can be provided (e.g., electroplated) into the openings 56 over the seed layer (not shown). The seed and/or adhesion layer(s) can be removed from over an upper surface of the silicon bulk semiconductor portion 44' of the first element 40 by polishing (e.g., chemical mechanical polishing, or CMP) and/or wet etch techniques. The via formation process may also have low thickness variation, e.g., less than 1 micron thickness variation.

Figure 7G:
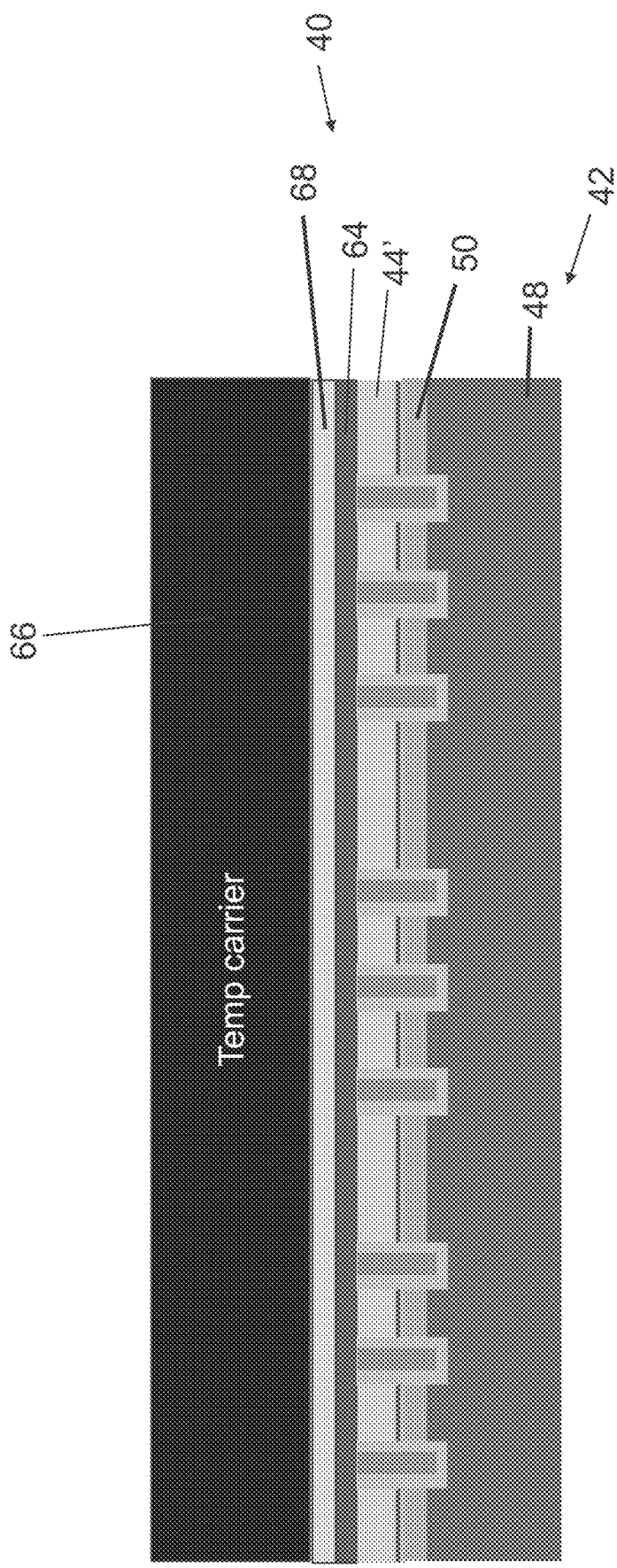
FIG. 7G illustrates the microelectronic structure bonded to a carrier.

In FIG. 7F, one or more dielectric and metallization layers, such as back-end-of-line (BEOL) layers 64 can be provided over the upper surface (front surface) of the bulk semiconductor portion 44' of the first element 40 and connected to the conductive vias 62. The BEOL layer(s) 64 can comprise traces to route electrical signals form the TSVs 62 to other portions of the microelectronic structure. In other embodiments, the BEOL layers 64 can be provided prior to the TSV etch of FIG. 7C. In FIG. 7G, a temporary carrier 66 can be adhered to the BEOL structure with a temporary adhesive 68. As explained above, the temporary adhesive 68 may be sensitive to high temperature processing. Because the embedded dielectric layer (the first dielectric layer 46 and the second dielectric barrier layer 50) has already been provided, there is no need for a subsequent backside dielectric deposition at high temperatures, and, therefore, the temporary adhesive 68 can be used to attach the carrier 66. In other embodiments, the carrier 66 can be directly bonded to the BEOL 64 without an adhesive.

Figure 7H:
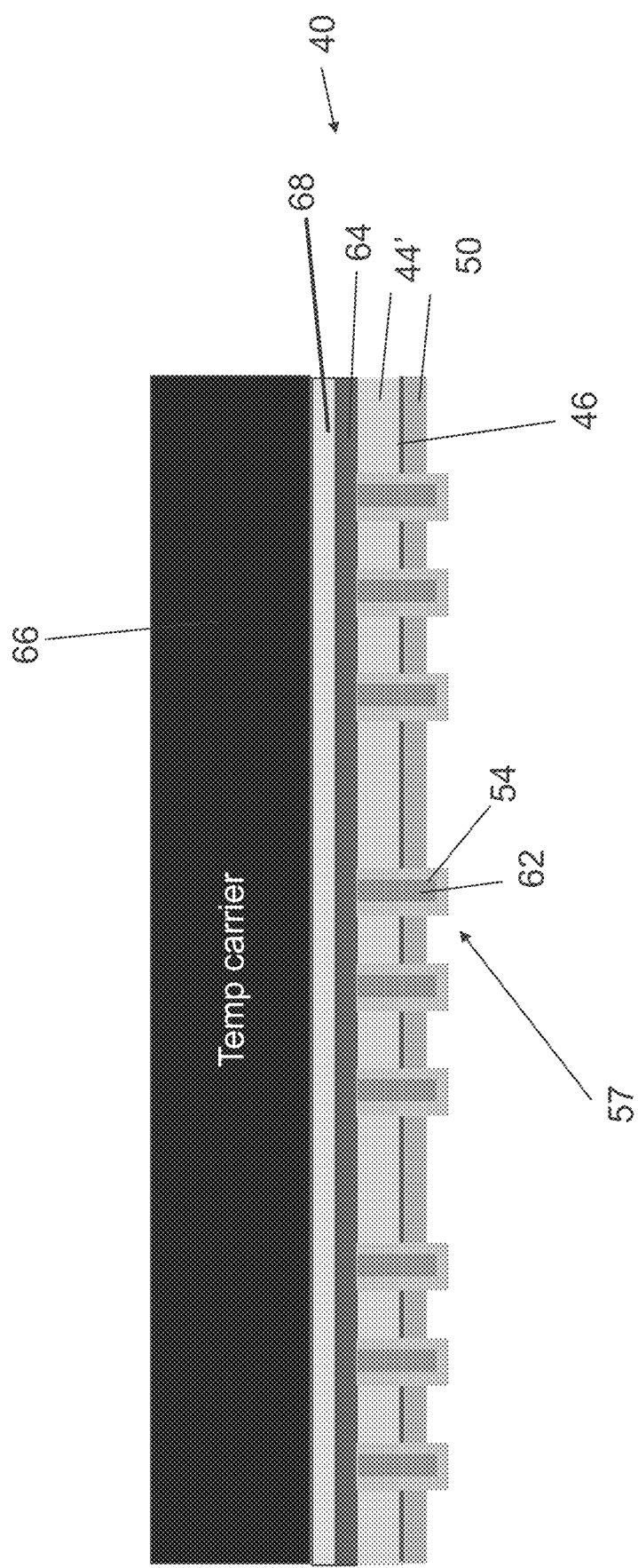
FIG. 7H illustrates the microelectronic structure bonded to the carrier after a removal process.

Turning to FIG. 7H, the second element 42 (including the bulk semiconductor portion 48 thereof) at a backside of the structure can be removed to expose the via structures 57. In some embodiments, the second element 42 can be backgrinded and/or polished to reveal the TSV structures 57. Once the semiconductor portion 48 of the second element 42 has been removed, the TSV structures 57 protrude from the second dielectric layer 50. Because the via openings 56 were formed with depths having a high degree of uniformity (e.g., the depth of the etch into the bulk semiconductor portion 48 of the second element 42 can be highly controlled due the selective nature of the majority of depth to stop on the embedded dielectric 50, and due its low aspect ratio), the lengths of the via structures 57 extending beyond the second dielectric layer 50 can have a high degree of uniformity. As shown in FIG. 7H, as compared with conventional processes, the disclosed embodiment need not use an additional dry etch, and need not use low temperature nitride (LTN) barrier and LTO dielectric layers, is therefore considerably simpler and less costly than typical backside TSV reveal processing.

Figure 7I:
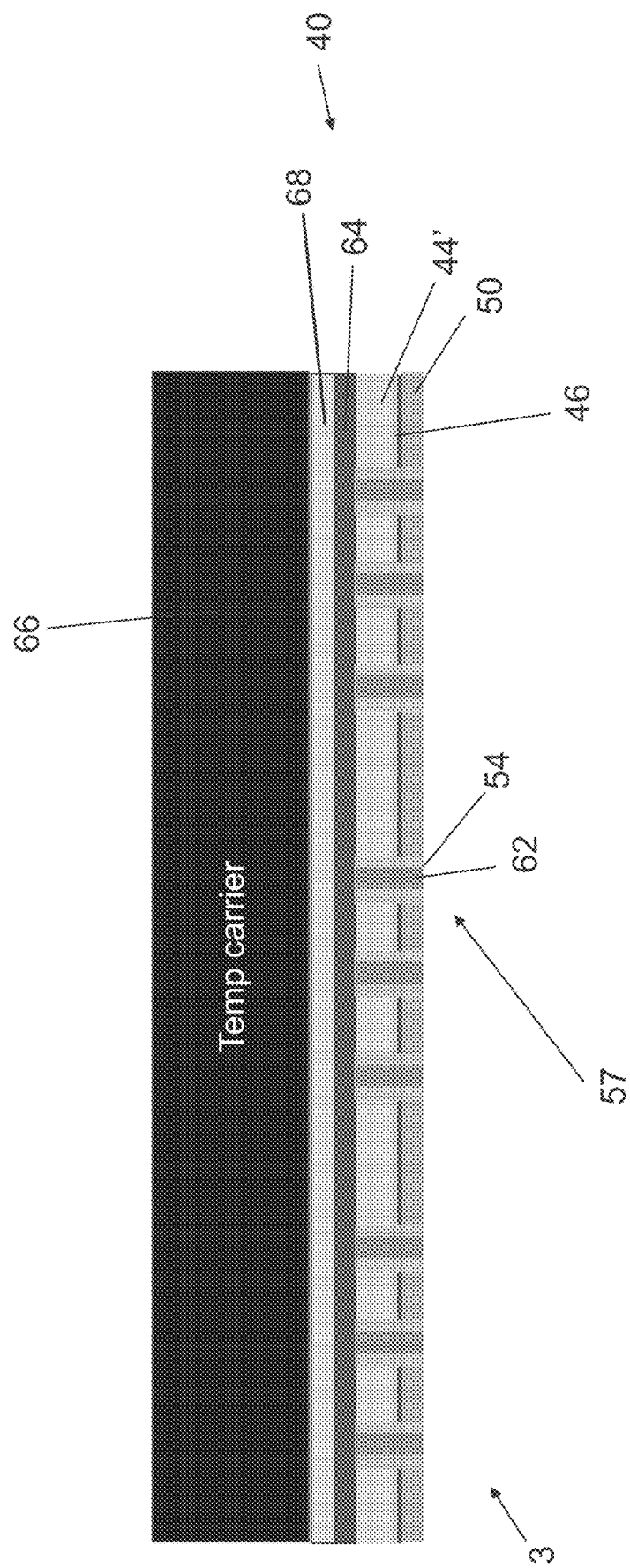
FIG. 7I illustrates the microelectronic structure bonded to the carrier after another removal process.

In FIG. 7I, the backside of the microelectronic structure 3 can be polished and planarized to remove the protruding portions of the TSV structures 57. For example, the backside can be polished using a CHIP process to a high degree of smoothness. In some embodiments, the CMP chemistry can be selected to recess the TSV structures 57 below the HTO dielectric surface to facilitate subsequent direct hybrid bonding. The higher quality HTO dielectric layer may be suitable for directly bonding to another element or structure. For example, as shown in FIG. 7J, and as explained below, the microelectronic structure 3 can be directly bonded to another device wafer 4 or stack of multiple wafers in a wafer-to-wafer (W2 W) process. In FIG. 7K, the temporary carrier 66 and adhesive 68 can be removed. The microelectronic structure 3 can be integrated into a larger electronic system, or additional layers of elements can be integrally formed on or laminated (e.g., bonded) on the microelectronic structure 3. The bonded wafers can be singulated into a plurality of bonded elements 5 or dies.

FIG. 7L illustrates an alternative die-to-wafer (D2 W) process, in which the microelectronic structure in wafer form can be provided on a dicing frame 70 and diced or singulated. Diced element 6 can be prepared for direct bonding, and picked and placed onto another element, such as a wafer 4, an integrated device die(s), a stack of multiple wafers, etc. The diced element 6 (e.g., diced microelectronic structures) can be directly bonded to the other element without an adhesive, as explained in more detail below. In some embodiments, the diced element 6 can comprise one of the elements 5.

As explained above, FIG. 8A shows the via structure 18 formed using a conventional backside TSV reveal, barrier deposition and LTO deposition process. FIG. 8B illustrates the via structure 57 formed according to the embodiments disclosed herein. As shown in FIG. 8B, a bulk semiconductor portion 44' of the first element 40 can have a first surface 72 and a second surface 74 opposite the first surface 72. The via structure 57 can extend at least partially through (e.g., completely through) the bulk semiconductor portion 44' along a direction non-parallel to the first surface 72. A first dielectric barrier layer 46 can be disposed on the first surface 72 of the bulk semiconductor portion 44' and extending to the via structure 57. In the illustrated embodiment, the first dielectric barrier layer 46 is disposed directly on and contacts the bulk semiconductor portion 44', although in other embodiments, additional layer(s) may intervene between the first dielectric barrier layer 46 and the bulk semiconductor portion 44'. A second dielectric layer 50 can be disposed on the first dielectric barrier layer 46 and can extend to the via structure 57. In the illustrated embodiment, the second dielectric layer 50 is disposed directly on and contacts the first dielectric barrier layer 46, but in other embodiments, additional layer(s) may intervene between the first dielectric barrier layer 46 and the second dielectric layer 50.

The via structure 57 can include a conductive via 62 and a dielectric liner 54 disposed around the conductive via 62. The second dielectric layer 50 can extend to (e.g., and can contact) the dielectric liner 54 without an intervening barrier. The via structure 57 can comprise a second barrier layer 78 extending along the conductive via between the metal (e.g., copper) of the conductive via 62 and the dielectric liner 54. As explained above, the second dielectric layer 50 can comprise a high temperature silicon oxide layer (HTO). Further, as explained above, a first sidewall 80 of the bulk semiconductor portion 44' adjacent the via structure 57 can have first artifacts indicative of a first etching process and a second sidewall 82 of the dielectric layer 50 adjacent the via structure 57 can have second artifacts indicative of a second etching process different from the first etching process. The first and second artifacts have different surface roughness profiles along the first and second sidewalls 80, 82. For example, the first artifacts comprise ridges indicative of a Bosch etch process. In some embodiments, the first artifacts comprises ridges and the second artifacts do not comprise ridges. In some other embodiments, the first artifacts comprise ridges with a first surface roughness and the second artifacts comprise ridges with a second surface roughness that is different (e.g., smoother) than the first surface roughness. Such artifacts can be visible through a scanning electron microscope (SEM) image of the final product.

As explained above, the first dielectric barrier layer 46 can comprise silicon nitride, although other types of dielectric materials can be used as explained above. The via structure 57 can extend completely through the bulk semiconductor portion 44', the first dielectric barrier layer 46, and the second dielectric layer 50. The via structure 57 can have an end surface 84 that is flush with, or recessed slightly relative to, a surface 86 of the second dielectric layer 50 that is opposite the bulk semiconductor portion 44'. In various embodiments, it can be advantageous to slightly recess the end surface 84 of the conductive via structure 57 relative to the surface 86 of the dielectric layer 50, to allow for thermal expansion during annealing and to form a direct metallic bond. Alternatively, the via structure 57, and particularly the conductive via 62 of the via structure 57 (e.g., copper) can be recessed from the second dielectric (HTO) surface by less than 30 nm, by less than 20 nm, particularly less than 15 nm or less than 10 nm, to facilitate subsequent direct hybrid bonding. The end surface 84 of the via structure 57 and the surface 86 of the dielectric layer 50 can comprise planarized surfaces.

Examples of Direct Bonding Methods and Directly Bonded Structures

Various embodiments disclosed herein relate to directly bonded structures in which two elements can be directly bonded to one another without an intervening adhesive. Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure.

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, direct hybrid bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of Direct Bond Interconnect, or DBI®, techniques commercially available from Xperi of San Jose, CA, can enable high density of pads connected across the direct bond interface (e.g., small or fine pitches for regular arrays). In some embodiments, the pitch of the bonding pads, or conductive traces embedded in the bonding surface of one of the bonded elements, may be less than 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 3 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. In one application, a width of the first element in the bonded structure is similar to a width of the second element. In some other embodiments, a width of the first element in the bonded structure is different from a width of the second element. Similarly, the width or area of the larger element in the bonded structure may be at least 10% larger than the width or are of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

In one embodiment, a microelectronic structure is disclosed. The microelectronic structure can include a bulk semiconductor portion having a first surface and a second surface opposite the first surface. The microelectronic structure can include a via structure extending at least partially through the bulk semiconductor portion along a direction non-parallel to the first surface. The microelectronic structure can include a first dielectric barrier layer disposed on the first surface of the bulk semiconductor portion and extending to the via structure. The microelectronic structure can include a second dielectric layer disposed on the first dielectric barrier layer and extending to the via structure.

In some embodiments, the via structure comprises a conductive via and a dielectric liner disposed around the conductive via, the second dielectric layer extending to the dielectric liner. In some embodiments, the via structure comprises a second barrier layer extending along the conductive via between the conductive via and the dielectric liner. In some embodiments, the second dielectric layer comprises a dielectric layer that includes silicon oxynitride. In some embodiments, the second dielectric layer comprises a high temperature silicon oxide layer. In some embodiments, the second dielectric layer comprises a dielectric layer that includes silicon oxycarbonitride. In some embodiments, a first sidewall of the bulk semiconductor portion adjacent the via structure has first artifacts indicative of a first etching process and a second sidewall of the dielectric layer adjacent the via structure has second artifacts indicative of a second etching process different from the first etching process. In some embodiments, the first and second artifacts have different surface roughness profiles along the first and second sidewalls. In some embodiments, the first artifacts comprise ridges indicative of a Bosch etch process. In some embodiments, the first dielectric barrier layer comprises silicon nitride. In some embodiments, the via structure extends completely through the bulk semiconductor portion, the first dielectric barrier layer, and the second dielectric layer. In some embodiments, the via structure has an end surface that is recessed relative to a surface of the second dielectric layer that is opposite the bulk semiconductor portion. In some embodiments, the end surface of the via structure and the surface of the dielectric layer comprise planarized surfaces. In some embodiments, the second dielectric layer and the via structure are directly bonded to another element without an intervening adhesive along a bonding interface. In some embodiments, the second surface of the bulk semiconductor portion comprises an active surface that includes active circuitry, one or more insulating layers over the active surface, and back-end-of-line layers over the one or more insulating layers.

In another embodiments, a microelectronic structure is disclosed. The microelectronic structure can include a bulk semiconductor portion having a first surface and a second surface opposite the first surface; a dielectric layer disposed over the first surface of the bulk semiconductor portion; a via structure extending at least partially through the bulk semiconductor portion and through the dielectric layer along a direction non-parallel to the first surface, wherein a first sidewall of the bulk semiconductor portion adjacent the via structure has first artifacts indicative of a first etching process, and a second sidewall of the dielectric layer adjacent the via structure has second artifacts indicative of a second etching process different from the first etching process.

In some embodiments, a barrier dielectric layer intervenes between the dielectric layer and the bulk semiconductor portion but does not intervene between the dielectric layer and the via structure. In some embodiments, the via structure comprises a conductive via and a dielectric liner disposed around the conductive via, the dielectric layer extending to the dielectric liner. In some embodiments, the via structure comprises a second barrier layer extending along the conductive via between the conductive via and the dielectric liner. In some embodiments, the second dielectric layer comprises a high temperature silicon oxide layer. In some embodiments, the first and second artifacts have different surface roughness profiles along the first and second sidewalls. In some embodiments, the first artifacts comprise ridges indicative of a Bosch etch process. In some embodiments, the dielectric layer and the via structure are directly bonded to another element without an intervening adhesive along a bonding interface.

In another embodiment, a microelectronic structure is disclosed. The microelectronic structure can include a bulk semiconductor portion having a first surface and a second surface opposite the first surface; a via structure extending at least partially through the bulk semiconductor portion along a direction non-parallel to the first surface; a dielectric layer disposed on the bulk semiconductor portion and extending to the via structure, the dielectric layer comprising a high temperature silicon oxide layer. In some embodiments, a barrier dielectric layer intervenes between the dielectric layer and the bulk semiconductor portion but does not intervene between the dielectric layer and the via structure.

In another embodiment, a microelectronic structure is disclosed. The microelectronic structure can include a bulk semiconductor portion having a first surface and a second surface opposite the first surface; a via structure extending at least partially through the bulk semiconductor portion along a direction non-parallel to the first surface; a dielectric layer disposed on the bulk semiconductor portion and extending to the via structure, the dielectric layer comprising a silicon oxynitride layer. In some embodiments, a barrier dielectric layer intervenes between the dielectric layer and the bulk semiconductor portion but does not intervene between the dielectric layer and the via structure.

In another embodiment, a method of forming a microelectronic structure is disclosed. The method can include providing a semiconductor structure including an embedded dielectric layer; etching an opening through a front side of semiconductor structure to stop on the embedded dielectric layer; continuing to etch the opening through the embedded dielectric layer; depositing a conductive material into the opening to form a conductive via; and revealing the conductive via from a back side of the semiconductor structure.

In some embodiments, providing the semiconductor structure comprises providing a bulk semiconductor portion and a base substrate, the embedded dielectric layer disposed between the bulk semiconductor portion and the base substrate. In some embodiments, continuing to etch the opening comprises etching partially into the base substrate. In some embodiments, revealing the conductive via comprises removing the base substrate. In some embodiments, the method comprises forming at least a portion of the embedded dielectric layer on one of the bulk semiconductor portion and the base substrate. In some embodiments, forming the at least a portion of the embedded dielectric layer comprises forming a first barrier dielectric layer and a second dielectric layer on the first barrier dielectric layer. In some embodiments, the method comprises forming a first portion of the embedded layer on the bulk semiconductor portion and a second portion of the embedded dielectric layer on the base substrate. In some embodiments, the method comprises after depositing the conductive material, annealing the microelectronic structure. In some embodiments, revealing comprises polishing the back side of the semiconductor structure. In some embodiments, the method comprises directly bonding the polished back side of the semiconductor structure to another element without an intervening adhesive. In some embodiments, directly bonding comprises directly bonding a polished surface of the embedded dielectric layer and the conductive via to the another element without an intervening adhesive along a bonding interface.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

In one aspect, a microelectronic structure is disclosed. The microelectronic structure can include a bulk semiconductor portion that has a first surface and a second surface opposite the first surface. The microelectronic structure can include a via structure that extends at least partially through the bulk semiconductor portion along a direction that is non-parallel to the first surface. The microelectronic structure can include a first dielectric barrier layer that is disposed on the first surface of the bulk semiconductor portion and extending to the via structure. The microelectronic structure can include a second dielectric layer that is disposed on the first dielectric barrier layer and extending to the via structure.

In one embodiment, the via structure includes a conductive via and a dielectric liner that is disposed around the conductive via. The second dielectric layer can extend to the dielectric liner.

The via structure can include a second barrier layer that extends along the conductive via between the conductive via and the dielectric liner.

In one embodiment, the second dielectric layer includes a dielectric layer that includes silicon oxynitride.

In one embodiment, the second dielectric layer includes a high temperature silicon oxide layer.

In one embodiment, the second dielectric layer includes a dielectric layer that includes silicon oxycarbonitride.

In one embodiment, a first sidewall of the bulk semiconductor portion adjacent the via structure has first artifacts indicative of a first etching process and a second sidewall of the dielectric layer adjacent the via structure has second artifacts indicative of a second etching process different from the first etching process.

The first and second artifacts can have different surface roughness profiles along the first and second sidewalls.

The first artifacts includes ridges indicative of a Bosch etch process.

In one embodiment, the first dielectric barrier layer includes silicon nitride.

In one embodiment, the via structure extends completely through the bulk semiconductor portion, the first dielectric barrier layer, and the second dielectric layer.

In one embodiment, the via structure has an end surface that is recessed relative to a surface of the second dielectric layer that is opposite the bulk semiconductor portion.

The end surface of the via structure and the surface of the dielectric layer can include planarized surfaces.

In one embodiment, the second dielectric layer and the via structure are directly bonded to another element without an intervening adhesive along a bonding interface.

In one embodiment, the second surface of the bulk semiconductor portion includes an active surface that includes active circuitry, one or more insulating layers over the active surface, and one or more back-end-of-line layers over the one or more insulating layers.

In one aspect, a microelectronic structure is disclosed, the microelectronic structure can include a bulk semiconductor portion that has a first surface and a second surface opposite the first surface, a dielectric layer that is disposed over the first surface of the bulk semiconductor portion, and a via structure that extends at least partially through the bulk semiconductor portion and through the dielectric layer along a direction non-parallel to the first surface. A first sidewall of the bulk semiconductor portion adjacent the via structure has first artifacts indicative of a first etching process. A second sidewall of the dielectric layer adjacent the via structure has second artifacts indicative of a second etching process different from the first etching process.

In one embodiment, a barrier dielectric layer intervenes between the dielectric layer and the bulk semiconductor portion but does not intervene between the dielectric layer and the via structure.

The via structure can include a conductive via and a dielectric liner that is disposed around the conductive via. The dielectric layer can extend to the dielectric liner.

The via structure can include a second barrier layer that extends along the conductive via between the conductive via and the dielectric liner.

In one embodiment, the second dielectric layer includes a high temperature silicon oxide layer.

In one embodiment, the first and second artifacts have different surface roughness profiles along the first and second sidewalls.

The first artifacts can include ridges indicative of a Bosch etch process.

In one embodiment, the dielectric layer and the via structure are directly bonded to another element without an intervening adhesive along a bonding interface.

In one aspect, a microelectronic structure is disclosed. The microelectronic structure can include a bulk semiconductor portion that has a first surface and a second surface opposite the first surface, a via structure that extends at least partially through the bulk semiconductor portion along a direction non-parallel to the first surface, and a dielectric layer that is disposed on the bulk semiconductor portion and extends to the via structure. The dielectric layer includes a high temperature silicon oxide layer.

In one embodiment, a barrier dielectric layer intervenes between the dielectric layer and the bulk semiconductor portion but does not intervene between the dielectric layer and the via structure.

In one aspect, a microelectronic structure is disclosed, the microelectronic structure can include a bulk semiconductor portion that has a first surface and a second surface opposite the first surface, a via structure that extends at least partially through the bulk semiconductor portion along a direction non-parallel to the first surface, and a dielectric layer that is disposed on the bulk semiconductor portion and extends to the via structure. The dielectric layer includes a silicon oxynitride layer.

In one embodiment, a barrier dielectric layer intervenes between the dielectric layer and the bulk semiconductor portion but does not intervene between the dielectric layer and the via structure.

In one aspect, a method of forming a microelectronic structure is disclosed. The method can include providing a semiconductor structure that includes an embedded dielectric layer. The method can include etching an opening through a front side of semiconductor structure to stop on the embedded dielectric layer, the method can include continuing to etch the opening through the embedded dielectric layer, the method can include depositing a conductive material into the opening to form a conductive via. The method can include revealing the conductive via from a back side of the semiconductor structure.

In one embodiment, the semiconductor structure includes a plurality of embedded dielectric layer that includes the embedded dielectric layer.

In one embodiment, providing the semiconductor structure includes providing a bulk semiconductor portion and a base substrate. The embedded dielectric layer can be disposed between the bulk semiconductor portion and the base substrate.

The continuing to etch the opening can include etching partially into the base substrate.

The revealing the conductive via can include removing the base substrate.

The method can further include forming at least a portion of the embedded dielectric layer on one of the bulk semiconductor portion and the base substrate.

The forming the at least a portion of the embedded dielectric layer can include forming a first barrier dielectric layer and a second dielectric layer on the first barrier dielectric layer.

The method can further include forming a first portion of the embedded layer on the bulk semiconductor portion and a second portion of the embedded dielectric layer on the base substrate.

In one embodiment, the method further includes, after depositing the conductive material, annealing the microelectronic structure.

In one embodiment, the revealing includes polishing the back side of the semiconductor structure.

The method can further include directly bonding the polished back side of the semiconductor structure to another element without an intervening adhesive.

The directly bonding can includes directly bonding a polished surface of the embedded dielectric layer and the conductive via to the another element without an intervening adhesive along a bonding interface.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A microelectronic structure comprising:
a bulk semiconductor portion having a first surface and a second surface opposite the first surface;
a via structure extending at least partially through the bulk semiconductor portion along a direction non-parallel to the first surface;
a first dielectric barrier layer disposed on the first surface of the bulk semiconductor portion and extending to the via structure; and
a second dielectric layer disposed on the first dielectric barrier layer and extending to the via structure,
wherein the second surface of the bulk semiconductor portion comprises an active surface that includes active circuitry, and one or more back-end-of-line layers over the active surface.

2. The microelectronic structure of claim 1, wherein the via structure comprises a conductive via and a dielectric liner disposed around the conductive via, the second dielectric layer extending to the dielectric liner.

3. The microelectronic structure of claim 2, wherein the via structure comprises a second barrier layer extending along the conductive via between the conductive via and the dielectric liner.

4. The microelectronic structure of claim 1, wherein the second dielectric layer comprises a dielectric layer that includes silicon oxynitride.

5. The microelectronic structure of claim 1, wherein the second dielectric layer comprises a high temperature silicon oxide layer.

6. The microelectronic structure of claim 1, wherein the second dielectric layer comprises a dielectric layer that includes silicon oxycarbonitride.

7. The microelectronic structure of claim 1, wherein a first sidewall of the bulk semiconductor portion adjacent the via structure has first artifacts indicative of a first etching process and a second sidewall of the dielectric layer adjacent the via structure has second artifacts indicative of a second etching process different from the first etching process.

8. The microelectronic structure of claim 7, wherein the first and second artifacts have different surface roughness profiles along the first and second sidewalls.

9. The microelectronic structure of claim 8, wherein the first artifacts comprise ridges indicative of a Bosch etch process.

10. The microelectronic structure of claim 1, wherein the first dielectric barrier layer comprises silicon nitride.

11. The microelectronic structure of claim 1, wherein the second dielectric layer and the via structure are hybrid bonded to another element without an intervening adhesive along a bonding interface.

12. The microelectronic structure of claim 1, wherein the second dielectric layer and the via structure are directly bonded to another element without an intervening adhesive along a bonding interface.

13. The microelectronic structure of claim 1, wherein the via structure has an end surface that is recessed relative to a surface of the second dielectric layer that is opposite the bulk semiconductor portion, and the end surface of the via structure and the surface of the dielectric layer comprise planarized surfaces.

14. The microelectronic structure of claim 12, wherein the second dielectric layer and the via structure are hybrid bonded to another element without an intervening adhesive along a bonding interface.

15. A microelectronic structure comprising:
a bulk semiconductor portion having a first surface and a second surface opposite the first surface;
a dielectric layer disposed over the first surface of the bulk semiconductor portion; and
a via structure extending at least partially through the bulk semiconductor portion and through the dielectric layer along a direction non-parallel to the first surface, wherein a first sidewall of the bulk semiconductor portion adjacent the via structure has first artifacts indicative of a first etching process, and a second sidewall of the dielectric layer adjacent the via structure has second artifacts indicative of a second etching process different from the first etching process.

16. The microelectronic structure of claim 15, wherein a barrier dielectric layer intervenes between the dielectric layer and the bulk semiconductor portion but does not intervene between the dielectric layer and the via structure, and the via structure comprises a conductive via and a dielectric liner disposed around the conductive via, the dielectric layer extending to the dielectric liner.

17. The microelectronic structure of claim 15, wherein the second dielectric layer comprises a high temperature silicon oxide layer.

18. The microelectronic structure of claim 15, wherein the first and second artifacts have different surface roughness profiles along the first and second sidewalls.

19. The microelectronic structure of claim 15, wherein the dielectric layer and the via structure are directly bonded to another element without an intervening adhesive along a bonding interface.

20. A microelectronic structure comprising:
a bulk semiconductor portion having a first surface and a second surface opposite the first surface;
a via structure extending at least partially through the bulk semiconductor portion along a direction non-parallel to the first surface;
a dielectric layer disposed on the bulk semiconductor portion and extending to the via structure, the dielectric layer comprising a high temperature silicon oxide layer,
wherein a barrier dielectric layer intervenes between the dielectric layer and the bulk semiconductor portion but does not intervene between the dielectric layer and the via structure.

* * * * *